United States Patent
Kishi et al.

(10) Patent No.: US 10,910,032 B2
(45) Date of Patent: Feb. 2, 2021

(54) MAGNETORESISTIVE MEMORY DEVICE WITH DIFFERENT WRITE PULSE PATTERNS

(71) Applicant: TOSHIBA MEMORY CORPORATION, Tokyo (JP)

(72) Inventors: Tatsuya Kishi, Seongnam-si (KR); Tsuneo Inaba, Kanagawa (JP); Daisuke Watanabe, Seoul (KR); Masahiko Nakayama, Kanagawa (JP); Nobuyuki Ogata, Kanagawa (JP); Masaru Toko, Seoul (KR); Hisanori Aikawa, Seoul (KR); Jyunichi Ozeki, Seoul (KR); Toshihiko Nagase, Seoul (KR); Young Min Eeh, Seongnam-si (KR); Kazuya Sawada, Seoul (KR)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/400,048

(22) Filed: May 1, 2019

(65) Prior Publication Data
US 2019/0259438 A1    Aug. 22, 2019

Related U.S. Application Data

(62) Division of application No. 15/456,031, filed on Mar. 10, 2017, now Pat. No. 10,325,640.
(Continued)

(51) Int. Cl.
*G11C 11/16* (2006.01)
*G11C 7/10* (2006.01)

(52) U.S. Cl.
CPC ........ *G11C 11/1675* (2013.01); *G11C 7/1096* (2013.01); *G11C 11/1655* (2013.01); *G11C 11/1657* (2013.01); *G11C 11/1673* (2013.01)

(58) Field of Classification Search
None
See application file for complete search history.

(56) References Cited

U.S. PATENT DOCUMENTS

| 7,596,014 B2 | 9/2009 | Kawahara et al. |
| 8,120,948 B2 | 2/2012 | Nakayama et al. |

(Continued)

FOREIGN PATENT DOCUMENTS

| CN | 102007543 A | 4/2011 |
| JP | 2007188578 A | 7/2007 |

(Continued)

OTHER PUBLICATIONS

D. Apalkov, et al., "Write error rate ballooning in perpendicular STT-MRAM cell: Underlying mechanism and relation to back-hopping," Session MRAM and Spin Logic III, MMM Intermag, 2016 Joint Conference, Jan. 2016.
(Continued)

*Primary Examiner* — J. H. Hur
(74) *Attorney, Agent, or Firm* — Holtz, Holtz & Volek PC

(57) ABSTRACT

A memory device includes a magnetoresistive element including first and second magnetic layers and a non-magnetic layer provided between the first and second magnetic layers. The memory device also includes a write circuit which controls a first writing setting magnetization of the first and second magnetic layers in a parallel state and a second writing setting the magnetization of the first and second magnetic layers in an antiparallel state, and applies a write current to the magnetoresistive element. A first write current in the first writing includes a first pulse and a second pulse added to the first pulse. A width of the second pulse is smaller than a width of the first pulse, and a current level of the second pulse is different from a current level of the first pulse.

10 Claims, 19 Drawing Sheets

Related U.S. Application Data

(60) Provisional application No. 62/385,907, filed on Sep. 9, 2016.

(56) References Cited

U.S. PATENT DOCUMENTS

| | | |
|---|---|---|
| 8,411,499 B2 | 4/2013 | Ohmori et al. |
| 2007/0159875 A1 | 7/2007 | Shimomura et al. |
| 2010/0073998 A1* | 3/2010 | Nakayama ............ H01L 27/228 |
| | | 365/158 |
| 2011/0026322 A1 | 2/2011 | Ohmori et al. |
| 2011/0032744 A1 | 2/2011 | Ohmori et al. |
| 2011/0222333 A1 | 9/2011 | Ito |
| 2011/0249490 A1 | 10/2011 | Zhu et al. |
| 2013/0250666 A1 | 9/2013 | Shimomura |
| 2014/0347918 A1 | 11/2014 | Lee et al. |
| 2015/0023093 A1 | 1/2015 | Schneider et al. |
| 2016/0042781 A1 | 2/2016 | Alam et al. |

FOREIGN PATENT DOCUMENTS

| | | |
|---|---|---|
| JP | 4837013 B2 | 12/2011 |
| JP | 2013149343 A | 8/2013 |
| JP | 2013201220 A | 10/2013 |
| WO | 2009128485 A1 | 10/2009 |
| WO | 2009128486 A1 | 10/2009 |
| WO | 2009145161 A1 | 12/2009 |

OTHER PUBLICATIONS

Tai Min, et al., "A Study of Write Margin of Spin Torque Transfer Magnetic Random Access Memory Technology," IEEE Transactions on Magnetics, vol. 46, No. 6, Jun. 2010, pp. 2322-2327.

* cited by examiner

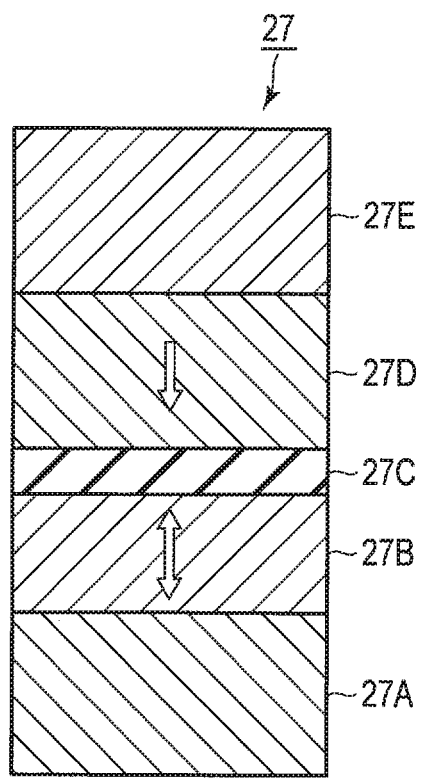
F I G. 4

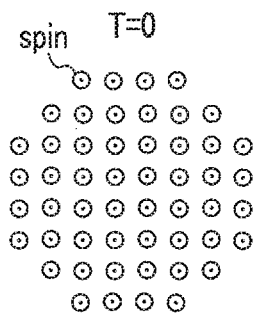
F I G. 15
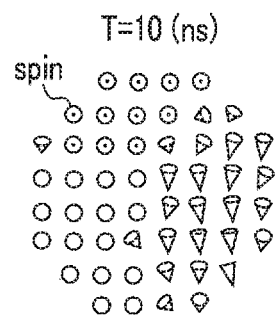
F I G. 16
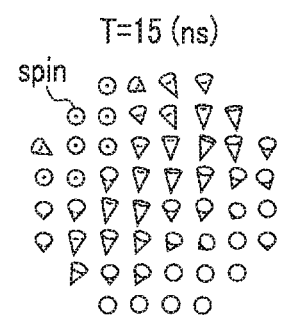
F I G. 17
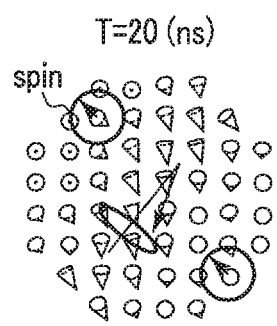
F I G. 18
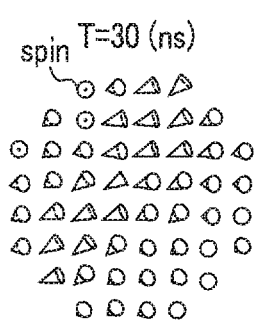
F I G. 19
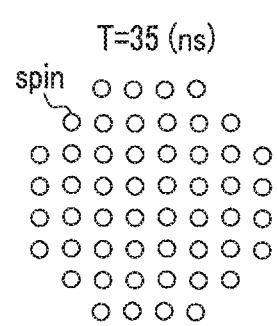
F I G. 20

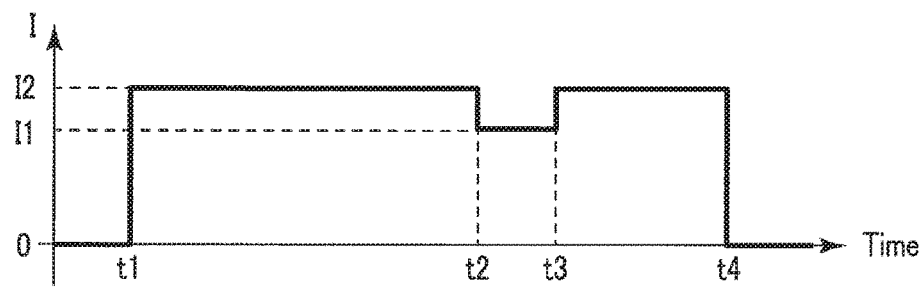
F I G. 24
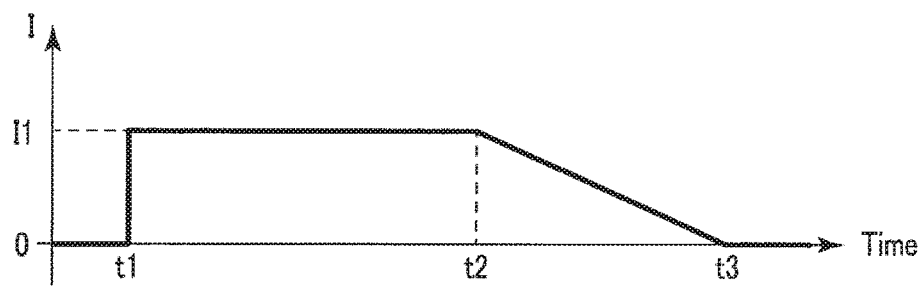
F I G. 25
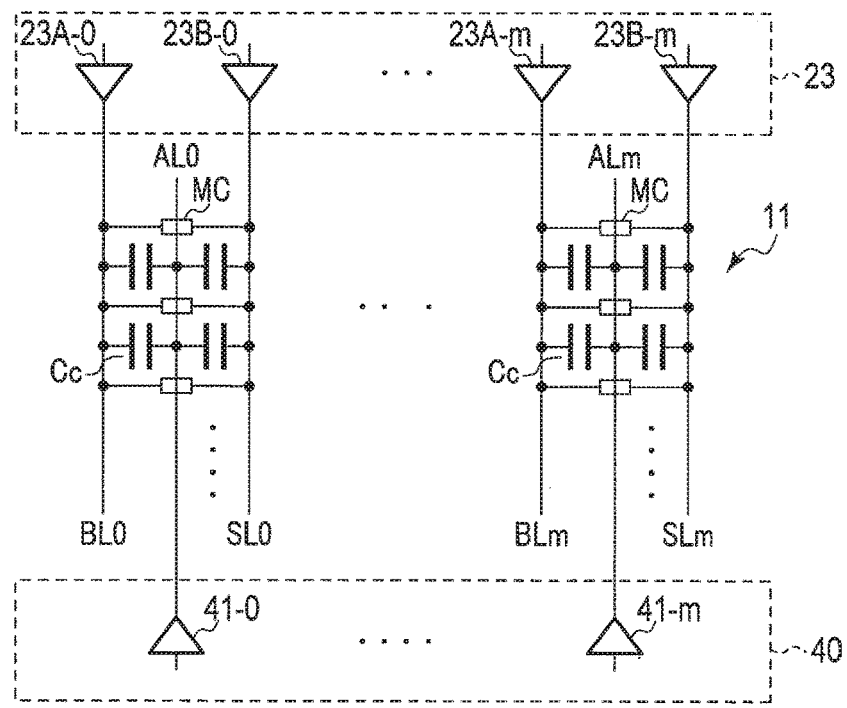
F I G. 26

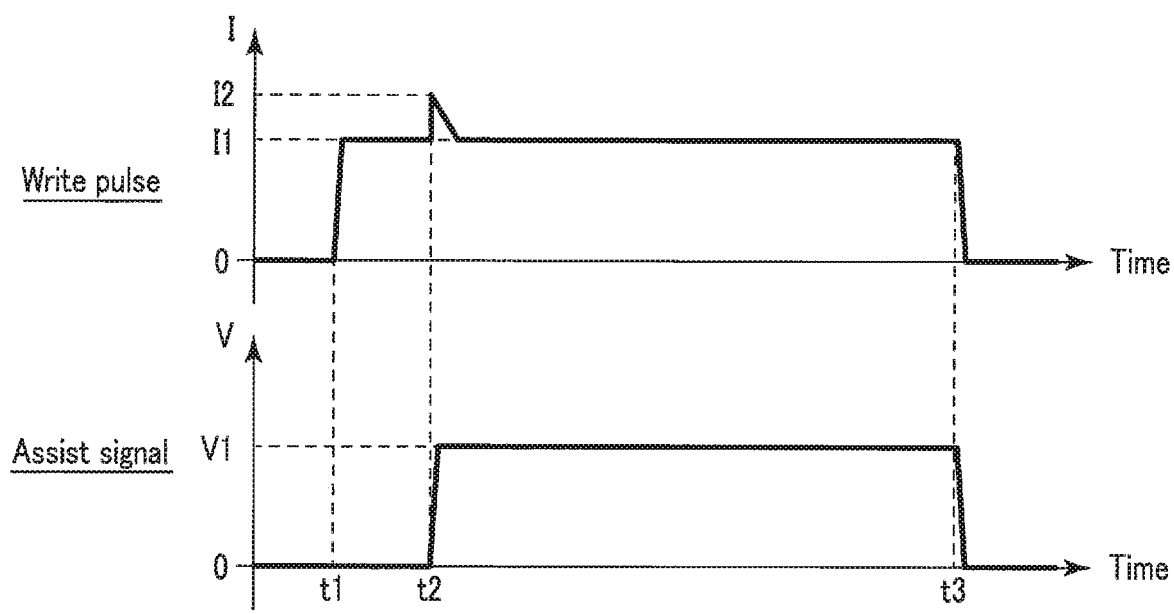
F I G. 27
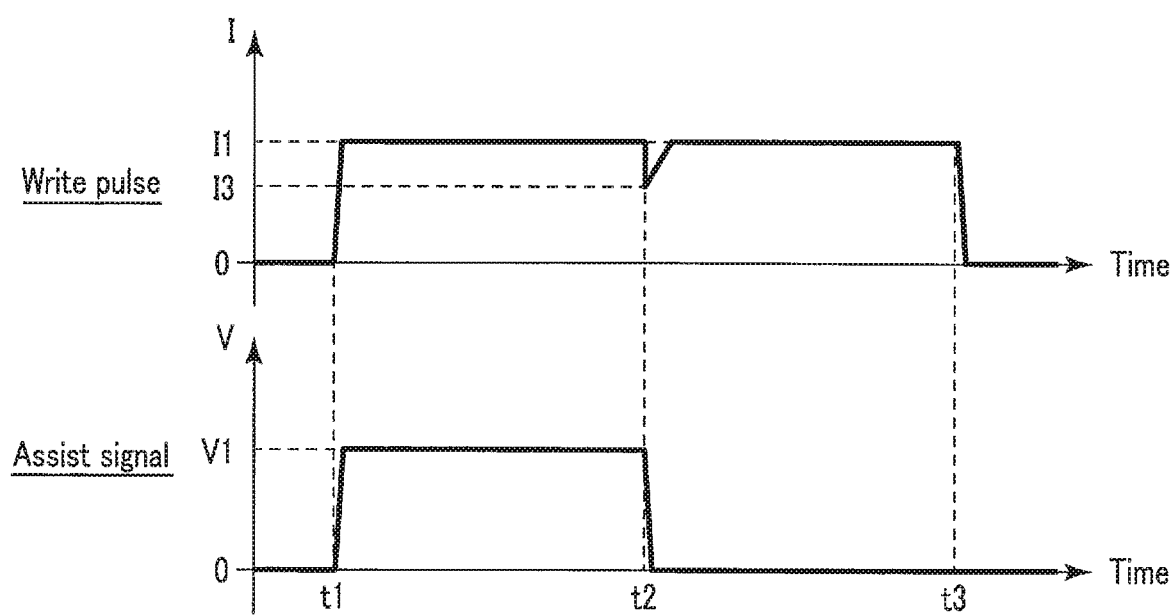
F I G. 28

MAGNETORESISTIVE MEMORY DEVICE WITH DIFFERENT WRITE PULSE PATTERNS

CROSS-REFERENCE TO RELATED APPLICATIONS

This application is a Divisional application of U.S. application Ser. No. 15/456,031, filed Mar. 10, 2017, which claims the benefit of U.S. Provisional Application Ser. No. 62/385,907, filed Sep. 9, 2016, the entire contents of both of which are incorporated herein by reference.

FIELD

Embodiments of the present invention relate to a memory device.

BACKGROUND

As a kind of semiconductor memory devices, a resistance change memory has been known. Further, as a kind of resistance change memories, an MRAM (magnetoresistive random access memory) has been known. The MRAM is a memory device in which a magnetoresistive element having a magnetoresistive effect is used in a memory cell storing information. MRAM writing scheme includes a spin-transfer torque writing method. In the spin-transfer torque writing method, the smaller the size of a magnetic body, the lower a spin-transfer current required for magnetization reversal, and therefore, the spin-transfer torque writing method is advantageous in high integration, small power consumption, and high performance.

BRIEF DESCRIPTION OF THE DRAWINGS

FIG. 4 is a cross-sectional view of an MTJ element shown in FIG. 3;

FIGS. 15, 16, 17, 18, 19, and 20 are schematic views for explaining a precession state shown until magnetization of a memory layer is reversed;

FIG. 24 is a view for explaining a write pulse according to a third example;

FIG. 25 is a view for explaining a write pulse according to a fourth example;

FIG. 26 is a circuit diagram of a memory cell array 11 and an assist circuit 40 according to a third embodiment;

FIG. 27 is a timing chart for explaining a write operation according to a first example;

FIG. 28 is a timing chart for explaining a write operation according to a second example;

DETAILED DESCRIPTION

Figure 1:
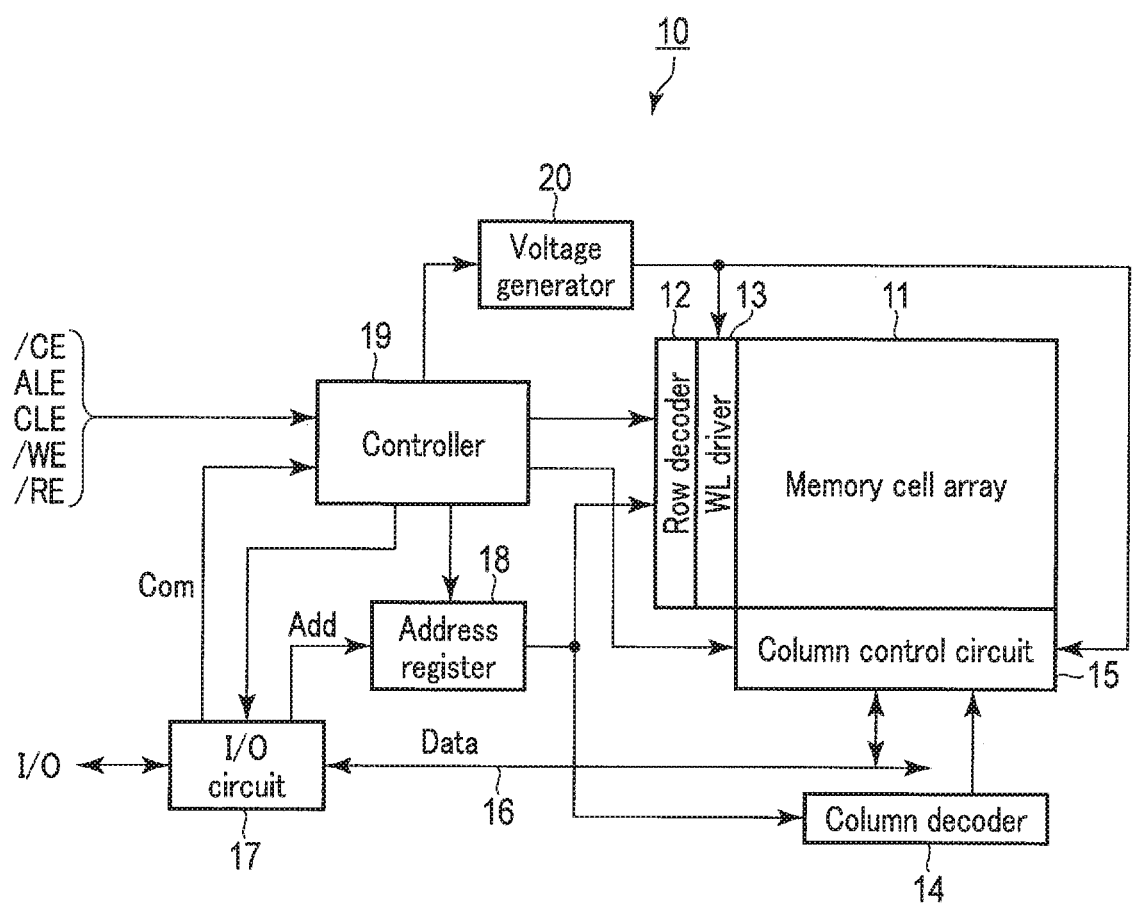
FIG. 1 is a block diagram of a semiconductor memory device according to a first embodiment.

In general, according to one embodiment, there is provided a memory device comprising:

a magnetoresistive element including first and second magnetic layers and a non-magnetic layer provided between the first and second magnetic layers; and a write circuit which controls a first writing setting magnetization of the first and second magnetic layers in a parallel state and a second writing setting the magnetization of the first and second magnetic layers in an antiparallel state, and applies a current pulse to the magnetoresistive element, wherein a first pulse pattern used in the first writing is different from a second pulse pattern used in the second writing.

[Consideration]

In writing in MRAM (magnetoresistive random access memory), in theory, wiring error occurs with a probability (WER: write error rate) given by the following formula (1) including as main parameters a current Iw flowing through a magnetic tunnel junction (MTJ) element (or a voltage Vw applied to the MTJ element), a write pulse width t, an anisotropic magnetic field Hk of a memory layer, and retention characteristics Δ of the memory layer.

$$WER = \exp\left[-(t-t_{inc})f_0\exp\left[-\Delta\left(1-\frac{Iw}{Ic0}\right)^n\left(1-\frac{Hext}{Hk}\right)^2\right]\right] \quad (1)$$

Here, n=2 is used. $t_{inc}$ is a time required until magnetization of the memory layer is actually reversed, $f_0$ is a natural frequency and about 1 GHz, Ic0 is a switching current threshold with respect to a 1 nsec pulse writing of the memory layer, and Hext is an external magnetic field. According to the above formula, as the write current Iw increases, a write probability (double) exponentially decreases, and the write error rate monotonously decreases.

In-plane MRAM shows that there are bits exhibiting abnormal behavior in which a voltage dependency of the write error rate WER deviates from theory. One example is called "ballooning", and in the voltage dependency of WER, a dependency branching in the degradation direction from the middle occurs. This is the degradation of WER and therefore causes severe errors in device operation. The other example is called "back-hopping", and WER increases on a high voltage side, deviating from theory. Although it is not necessary to consider them because a voltage is usually constant, they may occur with a small probability in small bits in which the switching current threshold Ic is small due to a variation of Ic, and therefore, attention should be paid.

Although "ballooning" has been subsequently confirmed in some universities and companies, a method called FMR (ferromagnetic resonance measurements) has shown that the cause is generation of a metastable magnetic domain in a memory layer of the MTJ element. Namely, when writing is performed, usually, a spin oscillated around one stabilization point by heat fluctuation receives spin torque to increase oscillation. If a sufficiently large volume or current flows, reversal occurs beyond a critical point and finally converges toward the other stabilization point. However, if a magnetic domain is generated near the critical point, the magnetization of the memory layer returns to the original state with a certain probability in order to form a metastable state. This deteriorates WER to cause ballooning in the voltage dependency.

As a countermeasure for this, it has been proposed that generation of a magnetic domain is suppressed by devising a material. On the other hand, it has been proposed to devise a writing method to reduce generation of a magnetic domain and thus to improve WER. Namely, there has been disclosed a method in which a single write pulse is divided into a plurality of shorter pulses, and in an interval between the short pulses, a reverse direction current is applied, or a current is cut off, so that a metastable state is caused to disappear to finally achieve writing in an intended magnetization direction.

In the recent MRAM, a vertical method is a mainstream method in terms of scalability and low Ic. Previously, in the vertical method, it has been considered that the ballooning described above does not occur. However, in 2016, it has been reported that also in the vertical method, ballooning forming a metastable magnetic domain to degrade WER occurs. Also in the vertical method, it is essential to cause the metastable magnetic domain to disappear, and the above-described method of dividing a pulse is effective.

However, a detailed analysis shows that in the case of "0"-writing, a metastable magnetic domain is easily formed, and a state in which a time $t_{inc}$ from a theoretic analysis till the substantial start of reversal is negative is achieved. Thus, it was found that application of a plurality of pulses is effective.

On the other hand, in the case of "1"-writing, a metastable magnetic domain is rarely generated, and, moreover, spin torque is relatively weak; therefore, the time $t_{inc}$ required until the reversal substantially starts is long. Thus, the situation is significantly different from the case of "0"-writing, and it was found that the application of a plurality of pulses rather deteriorates WER. Accordingly, a writing method in which a plurality of pulses are simply applied does not have a practical effect, and a new writing method is required.

Hereinafter, embodiments will be described with reference to the drawings. Incidentally, in the following description, the same reference numerals denote constituent elements having almost the same functions and arrangements, and a repetitive explanation will be made only when necessary. The drawings are schematic or conceptual, and the dimensions, ratios, and the like in the respective drawings are not necessarily identical to those in reality. The embodiments merely exemplify devices and methods for embodying the technical concepts of the embodiments, and the technical concepts of the embodiments do not limit the materials, shapes, structures, layouts, and the like of components to those to be described below.

In the following embodiments, a semiconductor memory device will be described by exemplifying an MRAM as a kind of resistance change memory.

First Embodiment

[1] Configuration of Semiconductor Device

FIG. 1 is a block diagram of a semiconductor memory device (MRAM) 10 according to the present embodiment. A memory cell array 11 includes a plurality of memory cells MC. Each of the memory cells MC includes a magnetic tunnel junction (MTJ) element as a memory element. A specific configuration of the memory cell MC will be described later.

In the memory cell array 11, a plurality of word lines WL extending in a row direction, a plurality of bit lines BL extending in a column direction crossing the row direction, and a plurality of source lines SL extending in the column direction are arranged. The memory cell MC is connected to the word line WL, the bit line BL, and the source line SL.

A word line driver (WL driver) 13 is connected to the word lines WL. The word line driver 13 applies a predetermined voltage to a selected word line, based on a row selection signal from a row decoder 12.

The row decoder 12 receives a row address from an address resistor 18. The row decoder 12 decodes the row address and sends a decode signal (row selection signal) to the word line driver 13.

A column decoder 14 receives a column address from the address resistor 18. The column decoder 14 decodes the column address and sends a decode signal (column selection signal) to a column control circuit 15.

The column control circuit 15 reads, writes, and erases data with respect to the selected column. The column control circuit 15 includes a sense amplifier (read circuit) and a write driver (write circuit). A specific configuration of the column control circuit 15 will be described later.

An input/output circuit (I/O circuit) 17 is connected to an external device through an input/output terminal I/O. The input/output circuit 17 exchanges data with the external device. Data exchange between the input/output circuit 17 and the column control circuit 15 is performed through a bus 16. The bus 16 is a bidirectional data bus.

A controller 19 controls the overall operation of a semiconductor memory device 10. The controller 19 receives various external control signals, such as a chip enable signal/CE, an address latch enable signal ALE, a command latch enable signal CLE, a write enable signal/WE, and a read enable signal/RE, from an external device (such as a host controller). "/" added to the name of each signal indicates active low.

The controller 19 identifies an address Add and a command Com supplied from the input/output terminal I/O, based on those external control signals. Then, the controller 19 transfers the address Add to the row decoder 12 and the column decoder 14 through the address resistor 18. In addition, the controller 19 decodes the command Com. The controller 19 performs the respective sequence controls related to reading, writing, and erasing of data in accordance with external control signals and commands.

A voltage generator 20 generates an internal voltage (including a voltage boosted over a power supply voltage, for example) required for each operation. The voltage generator 20 is controlled by the controller 19 to generate necessary voltages.

[1-1] Configuration of Column Control Circuit 15

Figure 2:
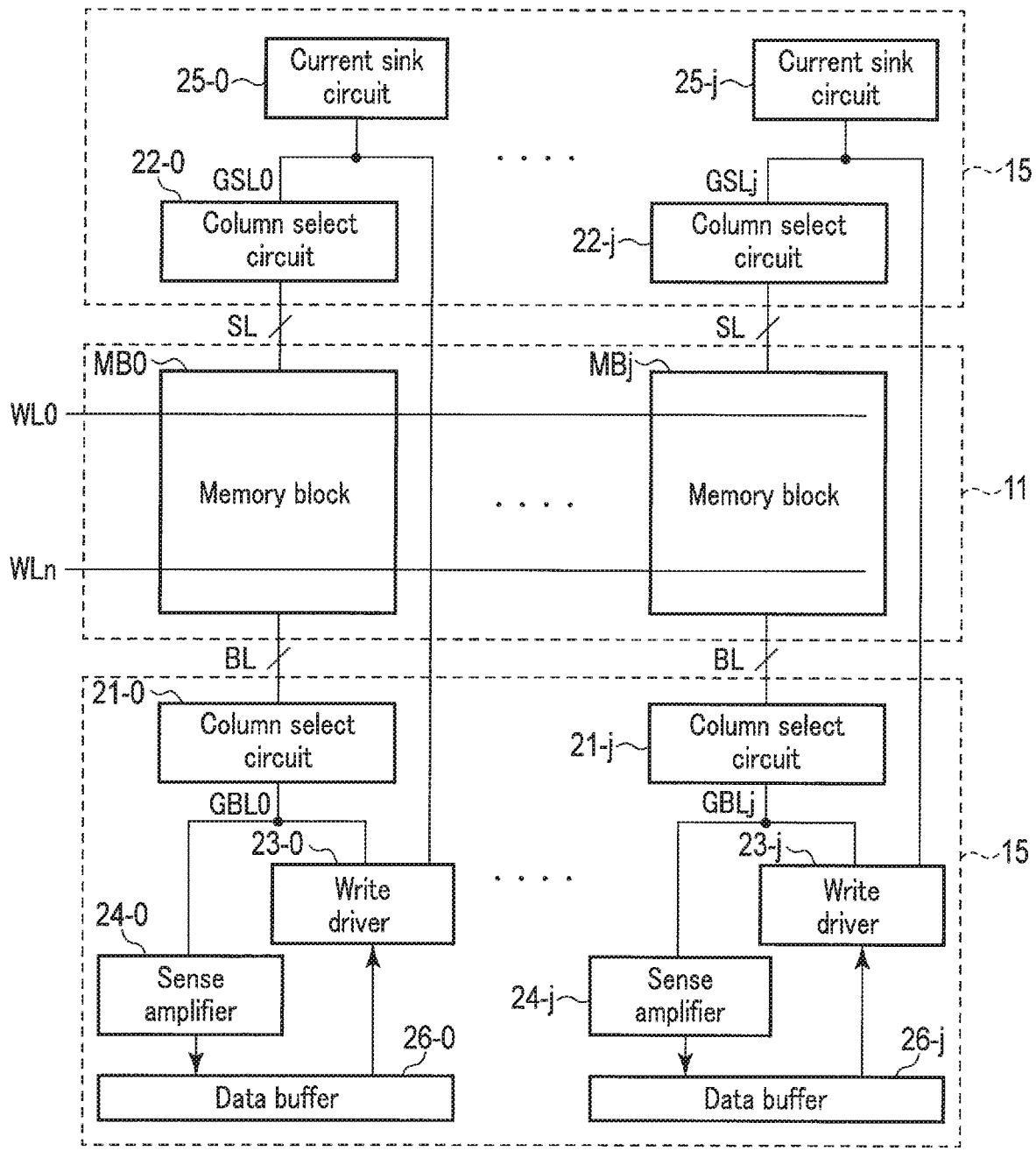
FIG. 2 is a block diagram of a column control circuit shown in FIG. 1.

FIG. 2 is a block diagram of the column control circuit 15 shown in FIG. 1. In FIG. 2, although a configuration example in which a bit line and a source line are hierarchized, a correspondence relationship between a memory cell and the bit line and the source line can be arbitrarily set.

For example, the memory cell array 11 is provided with a plurality of memory blocks MB0 to MBj. "j" is an integer of 1 or more. Each of the memory blocks MB is provided with a plurality of memory cells arranged in matrix. In the memory block MB, the word lines WL (WL0 to WLn), the bit lines BL, and the source lines SL are arranged. "n" is an integer of 1 or more.

The column control circuit 15 is provided with column select circuits 21-0 to 21-j, column select circuits 22-0 to 22-j, write drivers 23-0 to 23-j, sense amplifiers 24-0 to 24-j, current sink circuits 25-0 to 25-j, and data buffers 26-0 to 26-j. In the explanation of the present embodiment, when it is not necessary to particularly discriminate the write drivers 23-0 to 23-j, the branch numbers are omitted in the description, and explanation about the description with no branch number is common to each of the write drivers 23-0 to 23-j. Other reference signs with branch numbers are treated in the same manner.

A column select circuit 21 is connected to the bit lines BL arranged in the memory block MB. The column select circuit 21 selects the bit line BL based on a column select signal from the column decoder 14. The column select circuit 21 connects the selected bit line BL to a global bit line GBL.

A column select circuit 22 is connected to the source lines SL arranged in the memory block MB. The column select circuit 22 selects the source line SL based on the column select signal from the column decoder 14. The column select circuit 21 connects the selected source line SL to a global source line GSL.

A write driver 23 is connected to the global bit line GBL and the global source line GSL. In a write operation, the write driver 23 applies current to a selected memory cell and thereby writes data in the selected memory cell.

A sense amplifier 24 is connected to the global bit line GBL, and a current sink circuit 25 is connected to the global source line GSL. In a read operation, the current sink circuit 25 extracts current flowing through the global source line GSL. For example, the current sink circuit 25 applies a ground voltage VSS to the global source line GSL. In the read operation, the sense amplifier 24 senses current flowing through the selected memory cell and thereby reads data stored in the memory cell.

A data buffer 26 temporarily stores write data to be written in a memory cell in the write operation. The data buffer 26 temporarily stores read data read from the memory cell in the read operation.

[1-2] Configuration of Memory Block MB

Figure 3:
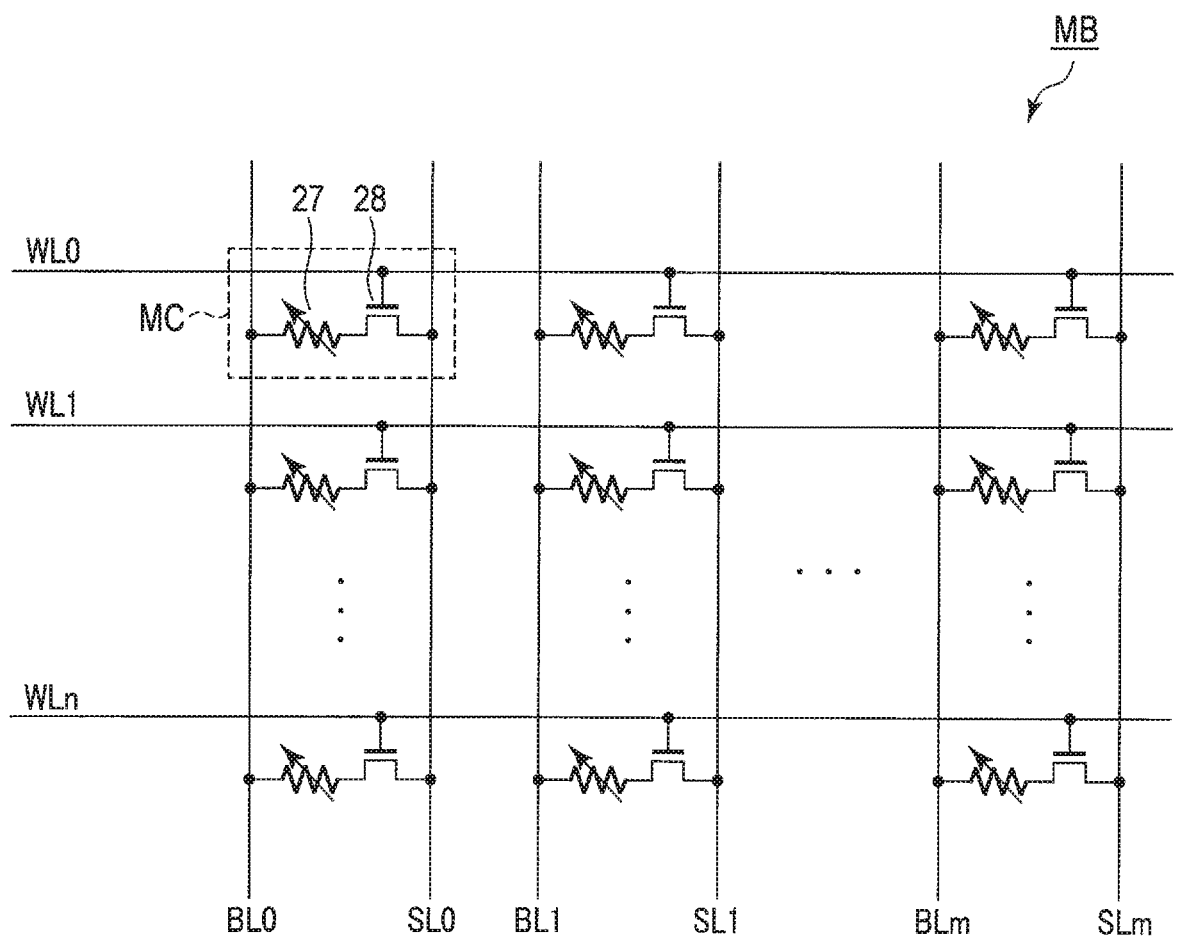
FIG. 3 is a circuit diagram of a memory block shown in FIG. 2.

FIG. 3 is a circuit diagram of the memory block MB shown in FIG. 2.

In the memory block MB, the word lines WL (WL0 to WLn) extending in the row direction, the bit lines BL (BL0 to BLm) extending in the column direction crossing the row direction, and the source lines SL (SL0 to SLm) extending in the column direction are arranged. "m" is an integer of 1 or more. The bit lines BL and the source lines SL are alternately arranged.

The memory cell MC includes a magnetic tunnel junction (MTJ) element 27 as a memory element and a cell transistor (a select transistor) 28. The MTJ element 27 stores data based on a change in resistive state and is, for example, a magnetoresistive element (magnetoresistive effect element) capable of rewriting data by a current. The cell transistor 28 is constituted of an n-channel metal oxide semiconductor (MOS) transistor, for example.

One terminal of the MTJ element 27 is connected to the bit line BL, and the other terminal is connected to a drain of the cell transistor 28. A gate of the cell transistor 28 is connected to the word line WL, and its source is connected to the source line SL.

[1-3] Configuration of MTJ Element 27

Next, an example of a configuration of the MTJ element 27 will be described. FIG. 4 is a cross-sectional view of the MTJ element 27 shown in FIG. 3.

The MTJ element 27 is configured by sequentially stacking a lower electrode 27A, a memory layer (free layer) 27B, a non-magnetic layer (tunnel barrier layer) 27C, a reference layer (fixed layer) 27D, and an upper electrode 27E. For example, the lower electrode 27A is electrically connected to the cell transistor 28, and the upper electrode 27E is electrically connected to the bit line BL. The stack order of the memory layer 27B and the reference layer 27D may be reversed.

The memory layer 27B and the reference layer 27D are each formed of a ferromagnetic material. The tunnel barrier layer 27C is formed of an insulating material such as MgO.

The memory layer 27B and the reference layer 27D each have a magnetic anisotropy in a vertical direction, for example, and their directions of easy magnetization are vertical directions. Here, the magnetic anisotropy in the vertical direction shows that a magnetization direction is vertical or substantially vertical to a film surface (an upper surface or a lower surface). The term "substantially vertical" may refer herein to the fact that a direction of remanent magnetization is within a range of $45°<\theta\leq90°$ with respect to a film surface. Each magnetization direction of the memory layer 27B and the reference layer 27D may be an in-plane direction.

In the memory layer 27B, the magnetization direction is variable (is reversed). The term "the magnetization direction is variable" means that when a predetermined write current is applied to the MTJ element 27, the magnetization direction of the memory layer 27B can be changed. In the reference layer 27D, the magnetization direction is invariable (is fixed). The term "the magnetization direction is invariable" means that when a predetermined write current is applied to the MTJ element 27, the magnetization direction of the reference layer 27D does not change.

The reference layer 27D is set to have a perpendicular magnetic anisotropy (or a coercive force) sufficiently larger than that of the memory layer 27B. The magnetic anisotropy can be set by adjusting material, area, and film thickness of a magnetic layer. Thus, a magnetization switching current of the memory layer 27B is reduced, and a magnetization switching current of the reference layer 27D is made larger than that of the memory layer 27B. Consequently, it is possible to achieve the MTJ element 27 provided with the memory layer 27B which is variable in magnetization direction with respect to a predetermined write current and the reference layer 27D which is invariable in magnetization direction with respect to the predetermined write current.

The present embodiment uses a spin-transfer torque writing method in which a write current is applied directly to the MTJ element 27, and a magnetization state of the MTJ element 27 is controlled by the write current. The MTJ element 27 can take a low resistance state or a high resistance state according to whether a relative relationship of magnetization between the memory layer 27B and the reference layer 27D is parallel or antiparallel. Namely, the MTJ element 27 is a variable resistance element.

If the write current traveling from the memory layer 27B to the reference layer 27D is applied to the MTJ element 27, the relative relationship of magnetization between the memory layer 27B and the reference layer 27D becomes parallel. In this parallel state, the MTJ element 27 has the lowest resistance value and is set to the low resistance state. The low resistance state of the MTJ element 27 is represented by data "0", for example.

On the other hand, if the write current travelling from the reference layer 27D to the memory layer 27B is applied to the MTJ element 27, the relative relationship of magnetization between the memory layer 27B and the reference layer 27D becomes antiparallel. In this antiparallel state, the MTJ element 27 has the highest resistance value and is set to the high resistance state. The high resistance state of the MTJ element 27 is represented by data "1", for example.

Consequently, the MTJ element 27 can be used as a memory element capable of storing 1-bit data (binary data). Allocation of the resistance state of the MTJ element 27 and data can be arbitrarily set In the present embodiment, a write operation in which the magnetization state of the MTJ element 27 is set from the antiparallel state (AP) to the parallel state (P) is referred to as "0"-writing (AP to P). A write operation in which the magnetization state of the MTJ element 27 is set from the parallel state (P) to the antiparallel state (AP) is referred to as "1"-writing (AP to P).

When data is read from the MTJ element 27, a read voltage is applied to the MTJ element 27, and the resistance value of the MTJ element 27 is sensed based on the read current flowing through the MTJ element 27 at this time. The read current is set to a value sufficiently smaller than a threshold in which magnetization reversal occurs due to spin-transfer torque.

[1-4] Configuration of Write Driver 23

Figure 5:
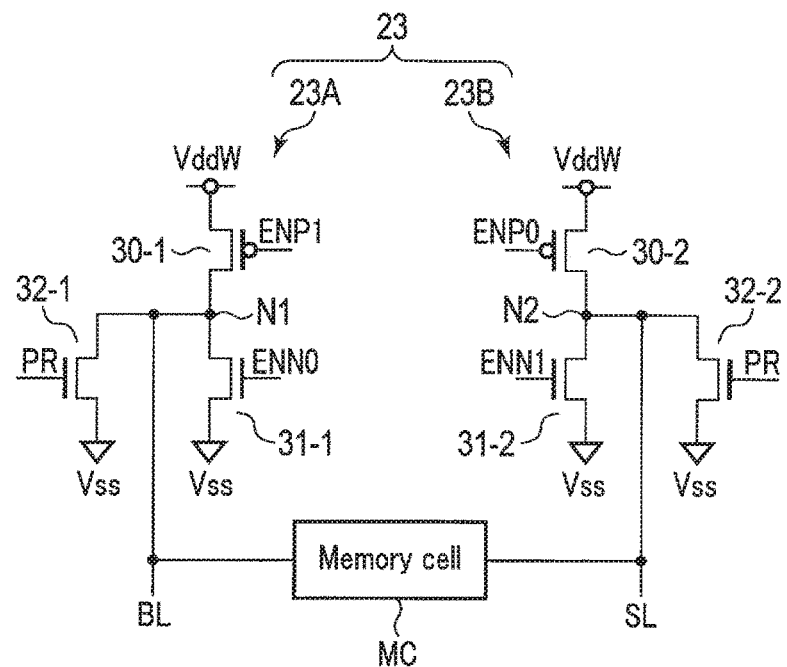
FIG. 5 is a circuit diagram of a write driver shown in FIG. 2.

FIG. 5 is a circuit diagram of the write driver 23 shown in FIG. 2. In the following description, since hierarchization of the bit line is not the subject matter of the present embodiment, the global bit line GBL and the global source line GSL will be described respectively as the bit line BL and the source line SL. The write driver 23 is provided with a write driver 23A for the bit line BL and a write driver 23B for the source line SL.

The write driver 23A is provided with a P-channel MOS transistor 30-1 and N-channel MOS transistors 31-1 and 32-1. A source of the transistor 30-1 is connected to a power supply terminal VddW, its drain is connected to a node N1, and its gate receives a signal ENP1 input from the controller 19. The node N1 is connected to the bit line BL. The transistor 30-1 applies a power supply voltage VddW (or a positive voltage different from the power supply voltage VddW) to the bit line BL when the signal ENP1 is asserted as a low level. The signal ENP1 is asserted in the case of "1"-writing.

A source of the transistor 31-1 is connected to a ground terminal Vss, its drain is connected to the node N1, and its gate receives a signal ENN0 input from the controller 19. The transistor 31-1 applies a ground voltage Vss (or a negative voltage) to the bit line BL when the signal ENN0 is asserted as a high level. The signal ENN0 is asserted in the case of "0"-writing.

A source of the transistor 32-1 is connected to a ground terminal Vss, its drain is connected to the node N1, and its gate receives a signal PR input from the controller 19. The transistor 32-1 is used for setting the bit line BL to a predetermined precharge voltage (for example, the ground voltage Vss).

The write driver 23B is provided with a P-channel MOS transistor 30-2 and N-channel MOS transistors 31-2 and 32-2. A source of the transistor 30-2 is connected to the power supply terminal VddW, its drain is connected to a node N2, and its gate receives a signal ENP0 input from the controller 19. The node N2 is connected to the source line SL. The transistor 30-2 applies the power supply voltage VddW (or a positive voltage different from the power supply voltage VddW) to the source line SL when the signal ENP0 is asserted as a low level. The signal ENP0 is asserted in the case of "0"-writing.

A source of the transistor 31-2 is connected to the ground terminal Vss, its drain is connected to the node N2, and its gate receives a signal ENN1 input from the controller 19. The transistor 31-2 applies the ground voltage Vss (or a negative voltage) to the source line SL when the signal ENN1 is asserted as a high level. The signal ENN1 is asserted in the case of "1"-writing.

A source of the transistor 32-2 is connected to the ground terminal Vss, its drain is connected to the node N2, and its gate receives the signal PR input from the controller 19. The transistor 32-2 is used for setting the source line SL to a predetermined precharge voltage (for example, the ground voltage Vss).

[2] Writing Method

Next, a writing method according to the present embodiment will be described.

In "0"-writing, a defective bit of WER, such as ballooning, is characterized by a property that a write voltage dependency does not follow the formula (1) and WER hardly changes with respect to an increase in voltage. On the other hand, the dependency can be examined by making the write voltage constant and changing a write pulse width. This case is also described by the formula (1), and if WER is plotted on a single logarithmic scale against the write pulse width, it becomes straight. When this dependency is examined in more detail, although a defective bit exhibiting a defect, such as ballooning, exhibits a linear dependency with respect to a pulse width, its inclination becomes gradual not less than approximately twice with respect to a normal bit. More specifically, although such a defective bit exhibits a linear dependency in a very short region in which the pulse width is not more than approximately 20 nsec, if the pulse width is not less than approximately 20 nsec, the bit suddenly changes the inclination and exhibits a linear dependency having a gradual inclination.

Figure 6:
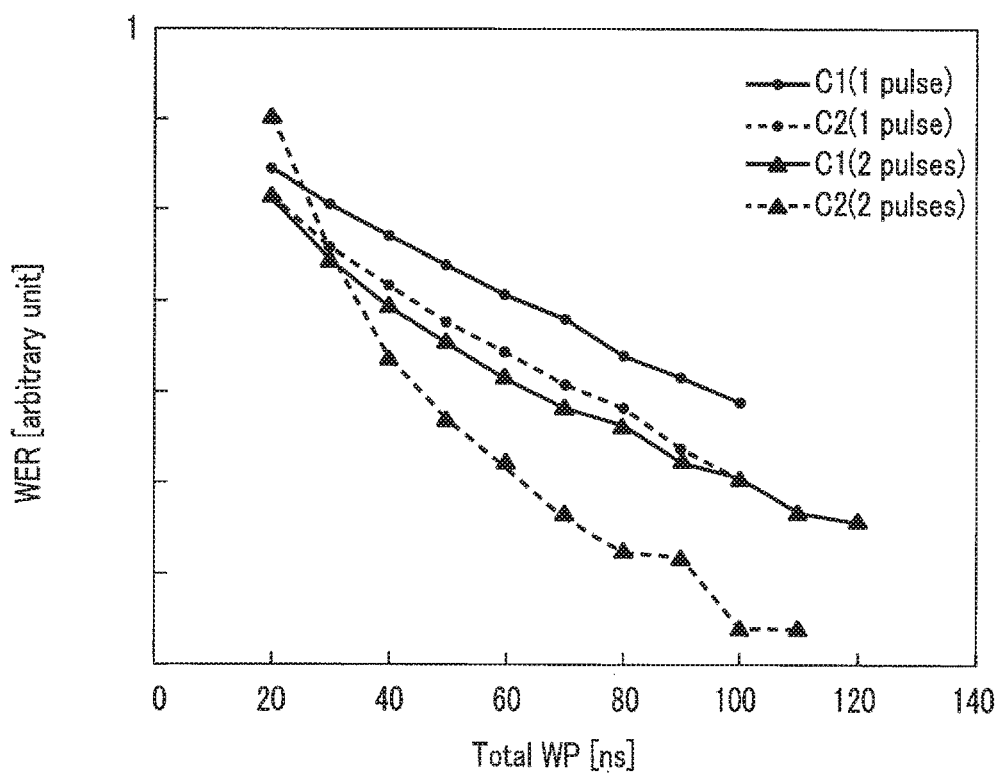
FIG. 6 is a graph for explaining a relationship between a write error rate and a write pulse.

Here, in "0"-writing, results of the case where the write pulse is applied twice to a defective bit are shown in FIG. 6. FIG. 6 shows a graph of two cases (C1, C2) where characteristics of a defective bit (a defective memory cell) differ. In the case C1, WER in a case where a single pulse is applied and WER in a case where pulse is applied twice are illustrated. Similarly, in the case C2, WER in a case where a single pulse is applied and WER in a case where pulse is applied twice are illustrated. An interval between the two pulses is 20 nsec, for example. The vertical axis of FIG. 6 represents WER (arbitrary unit), and the horizontal axis of FIG. 6 represents the entire width (nsec) of the write pulse WP. FIG. 6 shows that in the two cases (C1, C2), WER is further improved when writing is performed with two pulses.

Next, this phenomenon will be theoretically analyzed. It has been already described that a pulse width dependency of WER is given by the formula (1). Here, when data of a defective bit in which the inclination of the pulse width dependency is gradual is fitted with the formula (1), it is found that $t_{inc}$ becomes negative. Although $t_{inc}$ is originally defined as a time till the start of reversal, $t_{inc}$ becomes a negative value with respect to a defective bit and does not have a physical meaning. However, this shows that the following formula is established.

$$WER(2t) = \exp\left[-(2t + |t_{inc}|)f_0\exp\left[-\Delta\left(1 - \frac{Iw}{Ic0}\right)^2\left(1 - \frac{Hext}{Hk}\right)^2\right]\right]$$

$$= \exp\left[-2tf_0\exp\left[-\Delta\left(1 - \frac{Iw}{Ic0}\right)^2\left(1 - \frac{Hext}{Hk}\right)^2\right]\right] \times$$

$$\exp\left[(|t_{inc}|)f_0\exp\left[-\Delta\left(1 - \frac{Iw}{Ic0}\right)^2\left(1 - \frac{Hext}{Hk}\right)^2\right]\right]$$

$$= WER(t)^2 \times f(t_{inc})$$

Here, $f(t_{inc})$ is a function of $t_{inc}$ and takes a value of 1 or more. Accordingly, it is found that "WER(2t)>WER(t)$^2$". The left side of this formula means WER of a single pulse having a pulse width 2t(nsec), and the right side means WER obtained when a pulse width t(nsec) is applied twice. Namely, in a case where "$t_{inc}$<0", WER is further improved when writing is performed with two pulses, and experimental facts can be explained. Here, when "|$t_{inc}$|=0", "WER(2t)=WER(t)$^2$".

However, in actual device operation, since a finite interval is required between two pulses, the time of "2t+$t_{interval}$" is taken. Therefore, comparison with not WER(2t) but WER (2t+$t_{interval}$) should be performed. With reference to FIG. 6, the graph of twice-writing of pulses is further shifted rightward, and if the interval is too long, the graph coincides with a graph of once-writing of a pulse, so that the effect of the twice-writing of pulses disappears. An interval of this limit is given by "$t_{interval}$ (max)=|$t_{inc}$|".

It should be noted here that the following has been known. That is, in the case of "0"-writing, since a normal bit is "$t_{inc}$≈0", the above explanation can be applied. However, in the case of "1"-writing, since spin torque is relatively weak, "$t_{inc}$>0". "≈" means approximation. When the case of "$t_{inc}$>0" is analyzed similarly to the above, the following formula is established.

$$WER(2t) = \exp\left[-(2t + |t_{inc}|)f_0\exp\left[-\Delta\left(1 - \frac{Iw}{Ic0}\right)^2\left(1 - \frac{Hext}{Hk}\right)^2\right]\right]$$

$$= \exp\left[-2tf_0\exp\left[-\Delta\left(1 - \frac{Iw}{Ic0}\right)^2\left(1 - \frac{Hext}{Hk}\right)^2\right]\right] \times$$

$$\exp\left[-t_{inc}f_0\exp\left[-\Delta\left(1 - \frac{Iw}{Ic0}\right)^2\left(1 - \frac{Hext}{Hk}\right)^2\right]\right]$$

$$= WER(t)^2 \times g(t_{inc})$$

Since a function $g(t_{inc})$ is a function taking a value more than zero and less than 1, it is found that "WER(2t)< WER(t)$^2$". Namely, WER in the twice-writing of pulses is deteriorated more than WER in the once-writing of a pulse. Accordingly, with respect to "1"-writing, a single pulse having a large pulse width has an effect of further improving WER.

Based on the above experimental results and analysis of the experimental results, it is most effective for reduction in WER to use two pulses with respect to "0"-writing and to use a single pulse with respect to "1"-writing.

Even if the case of N-times writing of pulses in which N is at least two is considered by extending this concept, a similar conclusion is obtained. "N" is an integer of 2 or more. Namely, "0"-writing is analyzed as follows.

$$WER(Nt) = \exp\left[-(Nt + |t_{inc}|)f_0\exp\left[-\Delta\left(1 - \frac{Iw}{Ic0}\right)^2\left(1 - \frac{Hext}{Hk}\right)^2\right]\right]$$

$$= \exp\left[-Ntf_0\exp\left[-\Delta\left(1 - \frac{Iw}{Ic0}\right)^2\left(1 - \frac{Hext}{Hk}\right)^2\right]\right] \times$$

$$\exp\left[-(|t_{inc}|)f_0\exp\left[-\Delta\left(1 - \frac{Iw}{Ic0}\right)^2\left(1 - \frac{Hext}{Hk}\right)^2\right]\right]$$

$$= WER(t)^N \times f(t_{inc})$$

The function $f(t_{inc})$ appears also in this case, so that "WER(Nt)>WER(t)", and it is found that the N-times writing of pulses improves WER. Although it is necessary to consider an interval similarly to the twice-writing of pulses, in the case of the N-times writing of pulses, there is (N−1)-times interval. Accordingly, it is found that when the following conditions are satisfied, the interval has an improvement effect.

$$t_{interval} < \frac{N}{2(N-1)}(t - |t_{inc}|)$$

On the other hand, "1"-writing in the N-times writing of pulses is analyzed as follows.

$$WER(Nt) = \exp\left[-(Nt+|t_{inc}|)f_0\exp\left[-\Delta\left(1-\frac{Iw}{Ic0}\right)^2\left(1-\frac{Hext}{Hk}\right)^2\right]\right]$$

$$= \exp\left[-Ntf_0\exp\left[-\Delta\left(1-\frac{Iw}{Ic0}\right)^2\left(1-\frac{Hext}{Hk}\right)^2\right]\right]\times$$

$$\exp\left[-t_{inc}f_0\exp\left[-\Delta\left(1-\frac{Iw}{Ic0}\right)^2\left(1-\frac{Hext}{Hk}\right)^2\right]\right]$$

$$= WER(t)^N \times g(t_{inc})$$

Since a function $g(t_{inc})$ is a function taking a value more than zero and less than 1, it is found that "WER(Nt)<WER (t)". Namely, WER in the N-times writing of pulses is deteriorated more than WER in the once-writing of a pulse. Thus, in the case of the N-times writing of pulses, N-times writing of pulses is effective for "0"-writing, and with respect to "1"-writing, once-writing of a pulse in which a pulse width is large has an effect of further improving WER.

[2-1] Write Operation

Figure 7:
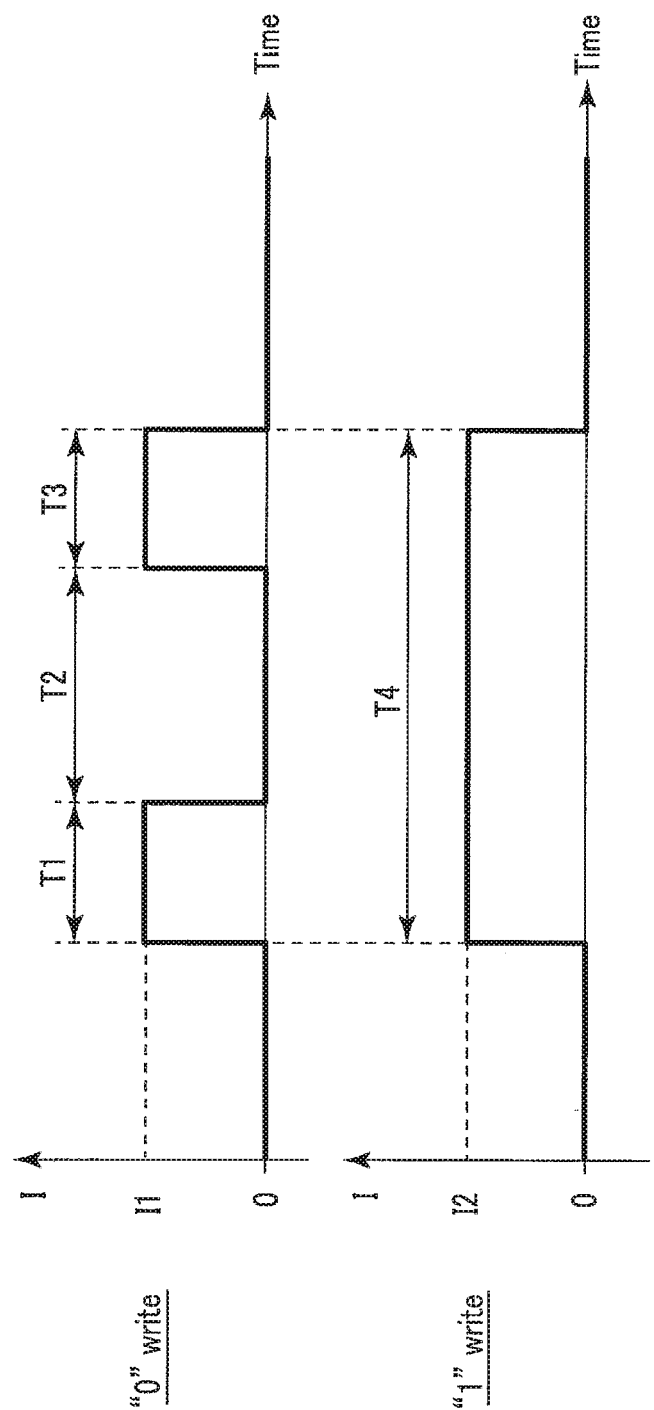
FIG. 7 is a diagram of a current waveform for explaining a write operation according to the first embodiment.

FIG. 7 is a diagram of a current waveform (a pulse pattern) for explaining a write operation according to the present embodiment. The vertical axis of FIG. 7 represents a current I flowing through the MTJ element, and the horizontal axis of FIG. 7 represents time.

First, "0"-writing (AP to P) in which the magnetization state of the MTJ element 27 is set from the antiparallel state (AP) to the parallel state (P) will be described.

In "0"-writing, the controller 19 applies twice-writing of pulses to the MTJ element 27. Specifically, the write driver 23B applies the voltage VddW to the source line SL, and the write driver 23A applies the ground voltage Vss to the bit line BL. In an interval between pulses, the write driver 23B applies the ground voltage Vss to the source line SL. A width of a first-time write pulse is T1, a width of a second-time write pulse is T3, and an interval between the first-time write pulse and the second-time write pulse is T2. For example, setting is performed such that "T1=T3=10 nsec" and "T2=20 nsec". A height (a current level) I1 of a pulse in "0"-writing can be arbitrarily set according to characteristics of the MTJ element.

Next, "1"-writing (P to AP) in which the magnetization state of the MTJ element 27 is set from the parallel state (P) to the antiparallel state (AP) will be described.

In "1"-writing, the controller 19 applies a single write pulse to the MTJ element 27. Specifically, the write driver 23A applies the voltage VddW to the bit line BL, and the write driver 23B applies the ground voltage Vss to the source line SL. A width of the single write pulse is T4. For example, setting is performed such that "T4=40 nsec". A height (a current level) I2 of a pulse in "1"-writing can be arbitrarily set according to characteristics of the MTJ element. The current I1 and the current I2 may be the same or different. In order to control a write current, a power supply VddW for the write driver 23A and a power supply VddW for the write driver 23B are suitably set.

In the present embodiment, "0"-writing and "1"-writing are adjusted to have the same total time of writing. However, without being limited to this control, the total time in "0"-writing and the total time in "1"-writing may be different from each other. Either the total time in "0"-writing or the total time in "1"-writing may be long. As a device operation, it is preferable that the both times have the same length.

In FIG. 7, although a current waveform flowing through the MTJ element is shown, a voltage waveform applied to the MTJ element is a pulse waveform being the same as that of FIG. 7. Accordingly, in FIG. 7, the current waveform may be reworded as the voltage waveform. Namely, the case where a write operation is achieved by a voltage waveform being the same as that of FIG. 7 is also encompassed in the present embodiment. In all of the following embodiments, the current waveform may be reworded as the voltage waveform.

[2-2] Explanation of Interval

Figure 8:
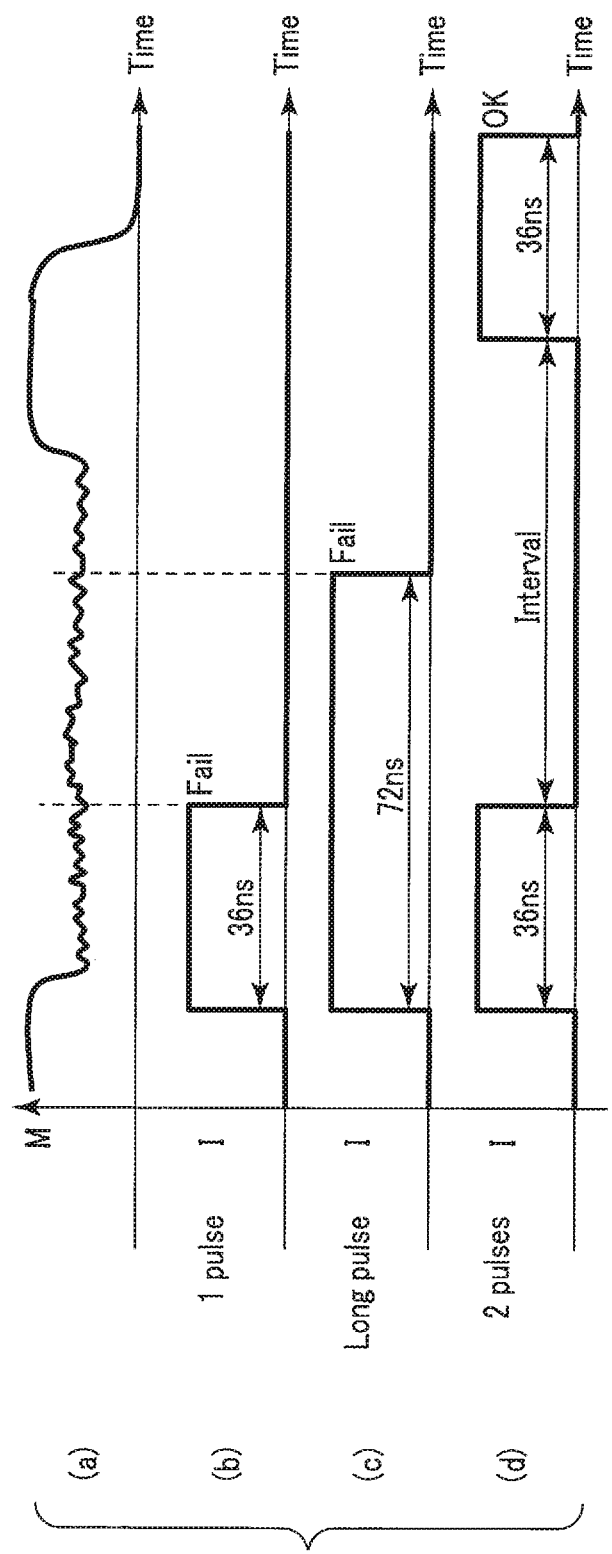
FIG. 8 is a view for explaining a relationship between magnetization of the MTJ element and the write pulse.

Next, a relationship between a write pulse width and an interval will be described. FIG. 8 is a view for explaining a relationship between magnetization of the MTJ element 27 and a write pulse. FIG. 8A shows a state of magnetization M of a memory layer. FIG. 8B shows writing using a single pulse. FIG. 8C shows writing using a single long pulse. FIG. 8D shows writing using two pulses. The wave line shown in FIG. 8A shows ballooning and is referred to as a metastable state.

When writing is performed using a single pulse having a pulse width of 36 nsec and a single pulse having a pulse width of 72 nsec, data "0" is not written in the MTJ element. For example, when writing is performed twice using two pulses each having a pulse width of 36 nsec, the data "0" is written in the MTJ element.

Figure 9:
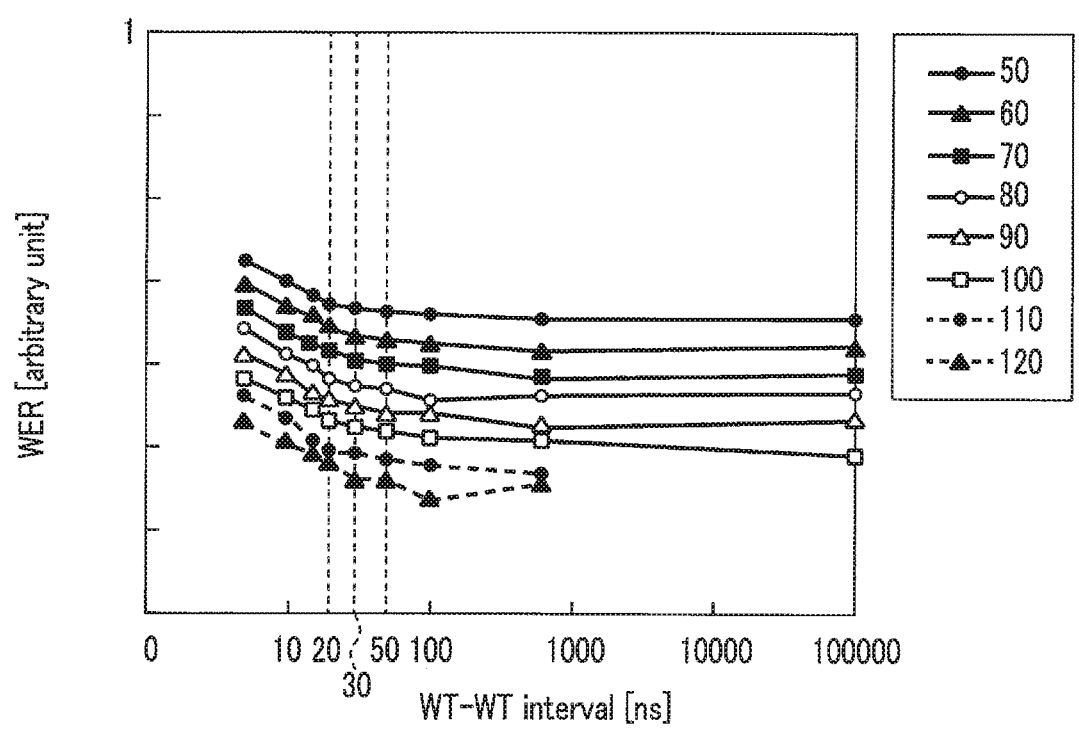
FIG. 9 is a graph for explaining a relationship between the write error rate and an interval.

FIG. 9 is a graph for explaining a relationship between a write error rate and an interval. The vertical axis of FIG. 9 represents the write error rate WER (arbitrary unit), and the horizontal axis of FIG. 9 represents the interval (WT-WT interval) between the two pulses in twice-writing. The vertical axis and the horizontal axis of FIG. 9 are logarithmic scales. FIG. 9 shows eight graphs, respectively, in which the total time (including no interval) of two pulses in twice-writing is 50 nsec, 60 nsec, 70 nsec, 80 nsec, 90 nsec, 100 nsec, 110 nsec, or 120 nsec. For example, the graph of 50 nsec is a graph in which two pulses of 25 nsec are used.

In all of the write pulses shown in FIG. 9, although WER can be reduced by increasing the interval, when the interval is not less than 50 nsec, WER hardly changes. If the interval is too long, a write time is increased, so that device performance is deteriorated. Accordingly, when the interval is set to approximately 30 nsec to 50 nsec, while WER is reduced, the write time can be prevented from being increased. In this specification, "to" includes the numerical values on both ends.

[3] Variations of First Embodiment

Next, variations of the first embodiment will be described. The figures shown in the following variations are pulse patterns used in a single write operation, that is, in the case where data "0" is written in a memory cell.

[3-1] First Variation

Figure 10:
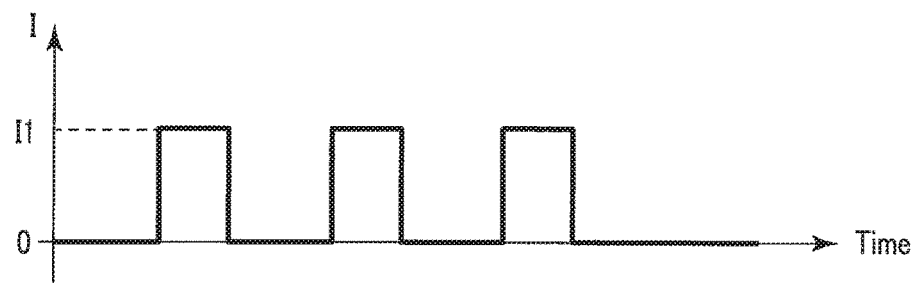
FIG. 10 is a view for explaining a write pulse according to a first variation.

FIG. 10 is a view for explaining a write pulse according to a first variation.

In "0"-writing, three write pulses may be used. Three or more write pulses may be used. Although "1"-writing is not particularly shown, a single pulse is used. In "0"-writing and "1"-writing, the total times of writing may be the same or different. As a device operation, it is preferable that the both times have the same length.

[3-2] Second Variation

Figure 11:
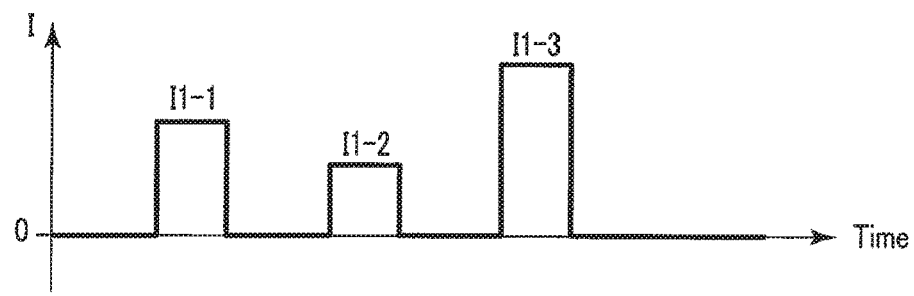
FIG. 11 is a view for explaining a write pulse according to a second variation.

FIG. 11 is a view for explaining a write pulse according to a second variation.

In "0"-writing, three write pulses are used, for example. The three write pulses may have different heights (current levels). In FIG. 11, when a first pulse height is V1-1, a second pulse height is V1-2, and a third pulse height is V1-3, "V1-1≠V1-2≠V1-3". The write pulse height can be controlled by changing the voltage VddW of the write driver 23B.

A plurality of write pulses may have different heights, and at least two of the write pulses may have different heights.

[3-3] Third Variation

Figure 12:
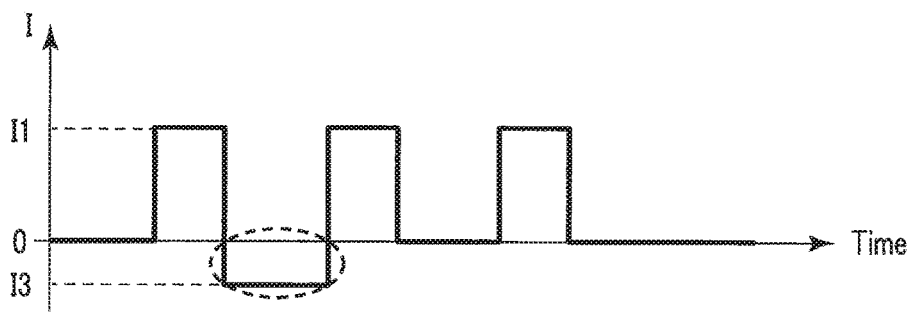
FIG. 12 is a view for explaining a write pulse according to a third variation.

FIG. 12 is a view for explaining a write pulse according to a third variation.

In "0"-writing, three write pulses are used, for example. A negative current I3 is used in at least one interval. Specifically, the write driver 23B applies the ground voltage Vss to the source line SL, and the write driver 23A applies a positive voltage corresponding to a current |I3| to the bit line BL.

[3-4] Fourth Variation

Figure 13:
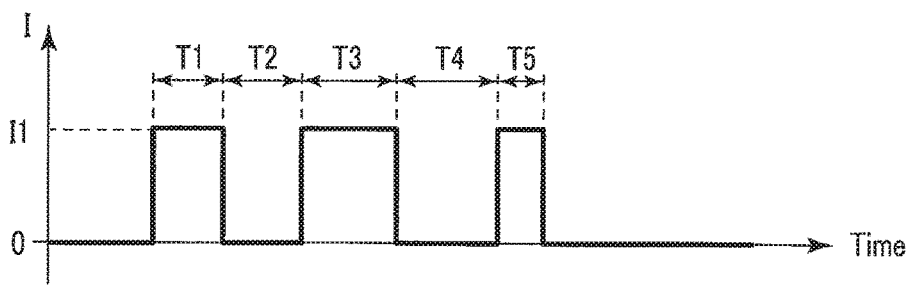
FIG. 13 is a view for explaining a write pulse according to a fourth variation.

FIG. 13 is a view for explaining a write pulse according to a fourth variation.

In "0"-writing, three write pulses are used, for example. In the three write pulses, a pulse width and an interval are different. A width of a first-time write pulse is T1, a first interval is T2, a width of a second-time write pulse is T3, a second interval is T4, and a width of a third-time write pulse is T5. Relationships of "T1≠T3≠T5" and "T2≠T4" are satisfied.

All write pulses may have different widths, and at least two of the write pulses may have different widths. All intervals may be different, and at least two of the intervals may be different.

[3-5] Fifth Variation

In the above variations, a rectangular pulse is used. However, without being limited to this, a modulated pulse other than the rectangular pulse may be used.

[4] Effects of First Embodiment

As described above in detail, in the first embodiment, the MTJ element 27, which includes the memory layer 27B, the reference layer 27D, and the tunnel barrier layer 27C provided between the memory layer 27B and the reference layer 27D, and the write driver (write circuit) 23 which applies a current pulse to the MTJ element 27 are provided. The write driver 23 controls "0"-writing turning magnetization of the memory layer 27B and the reference layer 27D from the antiparallel state into the parallel state and "1"-writing turning magnetization of the memory layer 27B and the reference layer 27D from the parallel state into the antiparallel state. A first pulse pattern used in "0"-writing is different from a second pulse pattern used in "1"-writing. Specifically, the first pulse pattern for "0"-writing is constituted of n successive pulses (n is an integer of 2 or more), and, on the other hand, the second pulse pattern for "1"-writing is constituted of a single pulse.

Accordingly, according to the first embodiment, the pulse pattern is changed between "0"-writing and "1"-writing, whereby a defective bit such as ballooning can be effectively reduced during each writing.

The first pulse pattern used in "0"-writing has two or more successive pulses, whereby the defective bit can be reduced more effectively, and the write error rate WER can be reduced.

Although the pulse pattern is different between "0"-writing and "1"-writing, the total times are set to be substantially the same. Consequently, since "0"-writing and "1"-writing are not required to be discriminated in terms of a circuit operation, an unnecessary control circuit may not be provided, and a circuit configuration can be simplified.

Second Embodiment

[1] Consideration

Figure 14:
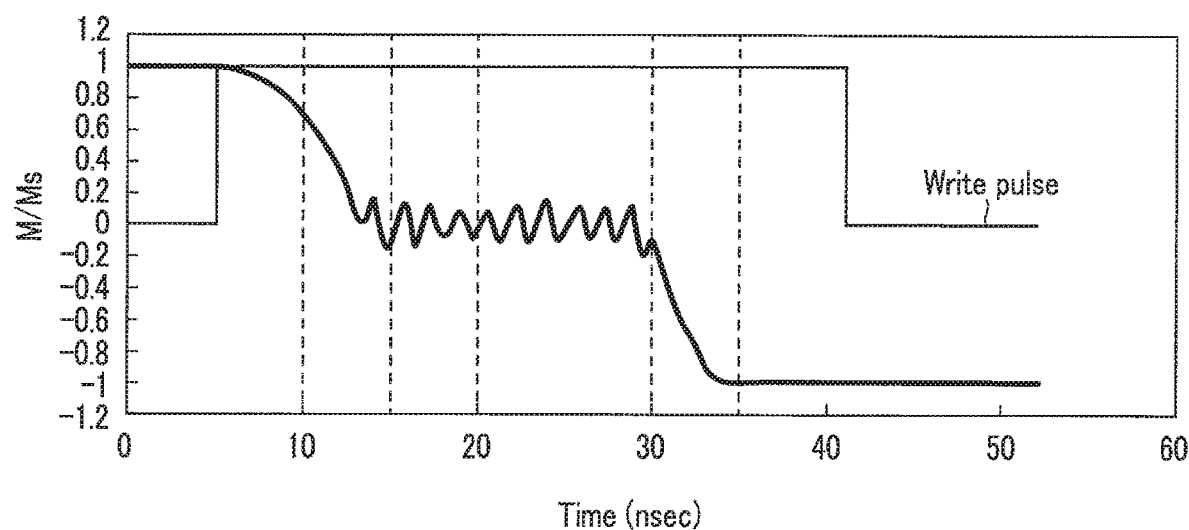
FIG. 14 is a view for explaining one example of magnetization of the MTJ element in "0"-writing.

A magnetization state in "0"-writing in which an MTJ element is set from an antiparallel state to a parallel state will be considered. FIG. 14 is a view for explaining one example of magnetization of the MTJ element in "0"-writing. The vertical axis of FIG. 14 is M/Ms of a memory layer, and the horizontal axis of FIG. 14 is a time (nsec). "Ms" represents a saturation magnetization of the memory layer, and "M" represents magnetization in a vertical direction of the memory layer. In FIG. 14, a write operation is performed using a single write pulse. The wave line of FIG. 14 shows ballooning, and corresponds to a metastable state.

FIGS. 15 to 20 are schematic views for explaining a precession state shown until magnetization of the memory layer is reversed. FIGS. 15 to 20 correspond to a plurality of times of FIG. 14 (T=0, T=10(nsec), T=15(nsec), T=20 (nsec), T=30(nsec), and T=35(nsec)).

In FIG. 15, one element schematically shows a spin, and the spin faces the near side of the sheet. In FIG. 20, one element shows a spin in a direction opposite to the spin of FIG. 15 (the depth side of the sheet). The arrow of FIG. 18 schematically shows precession. By sequentially referring to FIGS. 15 to 20, the state of reversal of magnetization of the memory layer can be understood.

In ballooning, the precession of a spin may interrupt propagation of a magnetic domain. Accordingly, if the precession increases as shown in FIG. 18, magnetization of the memory layer is not reversed, and the state may return to the antiparallel state. Consequently, WER is increased.

Thus, in the present embodiment, a current level of a write pulse is changed, thereby leading to an escape of the MTJ element 27 from the metastable state. Specifically, a write operation is performed using a write pulse having a plurality of steps (a plurality of current levels).

[2] Configuration of Write Driver 23

Figure 21:
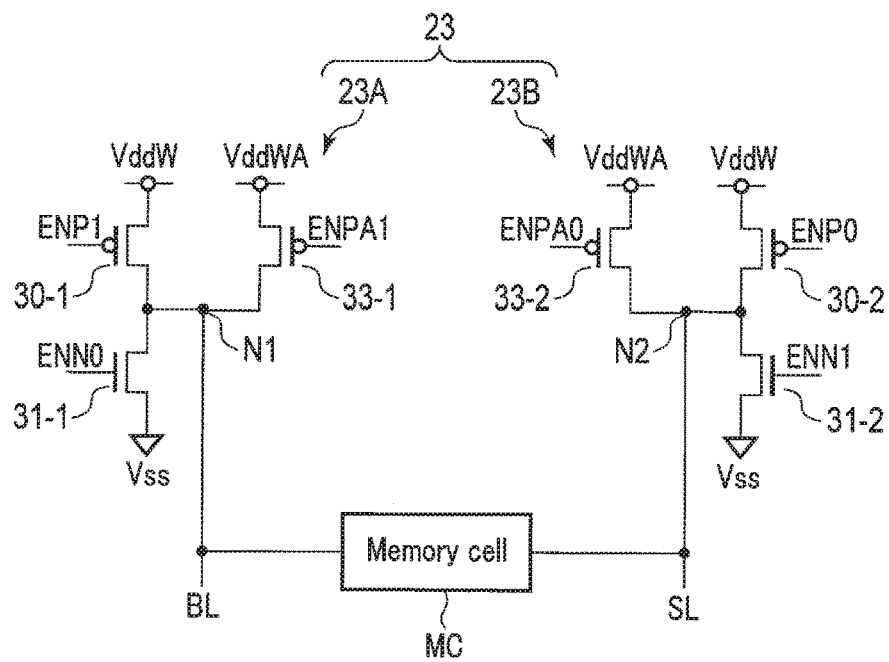
FIG. 21 is a circuit diagram of a write driver according to a second embodiment.

FIG. 21 is a circuit diagram of a write driver 23 according to the second embodiment. Illustration of a transistor for precharge is omitted. Hereinafter, only portions different from the write driver 23 (23A, 23B) shown in FIG. 5 will be described.

A source of a transistor 30-1 included in the write driver 23A is connected to a power supply terminal VddW. The transistor 30-1 applies the power supply voltage VddW to a bit line BL when a signal ENP1 is asserted as a low level.

The write driver 23A is further provided with a P-channel MOS transistor 33-1. A source of the transistor 33-1 is connected to a power supply terminal VddWA, its drain is connected to a node N1, and its gate receives a signal ENPA1 input from a controller 19. The transistor 33-1 applies the power supply voltage VddWA to the bit line BL when the signal ENPA1 is asserted as a low level. There is a relationship of "VddW<VddWA".

The write driver 23A constituted as above can selectively apply the voltage VddW and the voltage VddWA to the bit line BL according to the signal ENP1 and the signal ENPA1. Consequently, in "1"-writing, a level of a current applied to the MTJ element 27 can be changed.

A source of a transistor 30-2 included in the write driver 23B is connected to a power supply terminal VddW. The transistor 30-2 applies the power supply voltage VddW to a source line SL when a signal ENP0 is asserted as a low level.

The write driver 23B is further provided with a P-channel MOS transistor 33-2. A source of the transistor 33-2 is connected to the power supply terminal VddWA, its drain is connected to the node N2, and its gate receives a signal ENPA0 input from the controller 19. The transistor 33-2 applies the power supply voltage VddWA to the source line SL when the signal ENPA0 is asserted as a low level.

The write driver 23B constituted as above can selectively apply the voltage VddW and the voltage VddWA to the source line SL according to the signal ENP0 and the signal ENPA0. In "0"-writing, a level of a current applied to the MTJ element 27 can be changed.

[3] Writing Operation

Next, a writing method according to the second embodiment will be described. Hereinafter, "0"-writing (AP to P) in which the magnetization state of the MTJ element 27 is set from the antiparallel state (AP) to the parallel state (P) will be described. Regarding "1"-writing (P to AP) in which the magnetization state of the MTJ element 27 is set from the parallel state (P) to the antiparallel state (AP), a single write pulse is used as in the first embodiment.

[3-1] First Example

Figure 22:
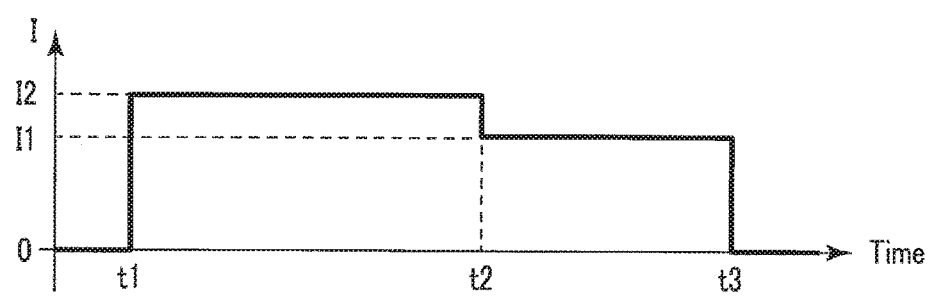
FIG. 22 is a view for explaining a write pulse according to a first example.

FIG. 22 is a view for explaining a write pulse according to a first example. The vertical axis of FIG. 22 represents a current I flowing through an MTJ element, and the horizontal axis of FIG. 22 represents time.

In "0"-writing, a controller 19 applies a write pulse having two current levels to an MTJ element 27. At time t1, the write driver 23 applies a current I2 to the MTJ element 27. Specifically, a write driver 23B applies a voltage VddWA to a source line SL, and a write driver 23A applies a ground voltage Vss to a bit line BL.

At time t2, the write driver 23 applies a current I1 to the MTJ element 27. There is a relationship of "I1<I2" Specifically, the write driver 23B applies a voltage VddW to the source line SL, and the write driver 23A applies the ground voltage Vss to the bit line BL. Thereafter, at time t3, the write pulse is turned off.

The timing (time t2) of switching a current level is set according to characteristics of the MTJ element 27. For example, the timing of switching the current level is set during a period of a metastable state. As another example, the timing of switching the current level is set from the middle to the end of the period of the metastable state. For example, a period of "t1-t2" is set longer than a period of "t2-t3".

[3-2] Second Example

Figure 23:
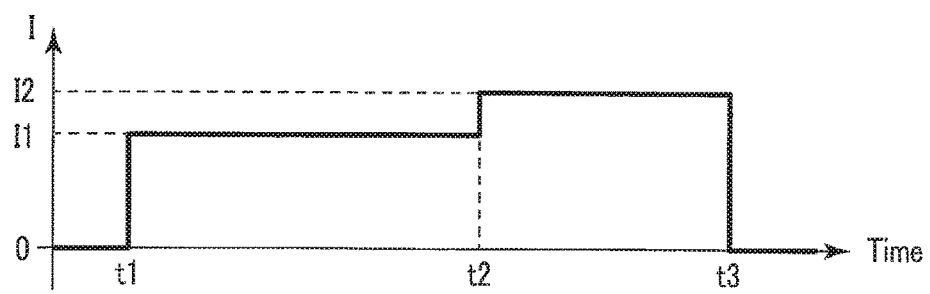
FIG. 23 is a view for explaining a write pulse according to a second example.

FIG. 23 is a view for explaining a write pulse according to a second example. In the second example, a current level is the inverse of the current level in the first example.

When "0"-writing is performed, a write driver 23 applies a current I1 to an MTJ element 27 at time t1 and applies a current I2 to the MTJ element 27 at time t2.

[3-3] Third Example

FIG. 24 is a view for explaining a write pulse according to a third example. In the third example, a current level of the write pulse is temporarily lowered.

When "0"-writing is performed, a write driver 23 applies a current I2 to an MTJ element 27 at time t1, applies a current I1 to the MTJ element 27 at time t2, and applies the current I2 to the MTJ element 27 at time t3. Thereafter, at time t4, the write pulse is turned off.

The timing of inserting a period of "t2-t3" in which the current level is low is set according to characteristics of the MTJ element 27. For example, the timing of inserting the period of "t2-t3" is set during a period of a metastable state. For example, a period of "t1-t2" is set longer than a period of "t3-t4". The period of "t2-t3" is set shorter than the period of "t1-t2" and the period of "t3-t4".

[3-4] Fourth Example

FIG. 25 is a view for explaining a write pulse according to a fourth example. In the fourth embodiment, a current level of the write pulse is gradually lowered from a certain time t2. Namely, the write pulse according to the fourth example has a trapezoidal shape.

When "0"-writing is performed, a write driver 23 applies a current I1 to an MTJ element 27 at time t1 and applies a gradient current gradually decreasing from the current I1 to the MTJ element 27 at time t2.

[4] Effects of Second Embodiment

As described above in detail, according to the second embodiment, the effects being the same as those of the first embodiment can be obtained.

In addition, propagation of a magnetic domain generated in a memory layer can be facilitated. Consequently, it is possible to suppress such writing failure that the state is returned to an antiparallel state in the middle of transition from the antiparallel state to a parallel state.

Third Embodiment

A third embodiment is another configuration example in "0"-writing for reducing WER.

[1] Configurations of Memory Cell Array 11 and Assist Circuit 40

FIG. 26 is a circuit diagram of a memory cell array 11 and an assist circuit 40 according to the third embodiment. In FIG. 26, illustration of a column select circuit, a global bit line, and a global source line is omitted. Hierarchization of a bit line and a source line is arbitrarily applicable. In the third embodiment, a plurality of assist lines AL and the assist circuit 40 are added. Configurations other than the assist lines AL and the assist circuit 40 are the same as those of the first embodiment.

In the memory cell array 11, assist lines AL0 to ALm are arranged. The assist line AL is disposed between a bit line BL and a source line SL. The assist line AL is not electrically connected to any of a memory cell MC, the bit line BL, and the source line SL and is a wiring extending linearly. The assist line AL may be disposed adjacent to a wiring (in the present embodiment, the source line SL) to which a positive voltage is applied in "0"-writing. For example, the assist line AL is constituted of a wiring layer at the same level as the source line SL.

The assist line AL adds a parasitic capacitance Cc between the assist line AL and the bit line BL. The assist line AL adds a parasitic capacitance Cc between the assist line AL and the source line SL. Namely, the assist line AL and the bit line BL are capacitively coupled. The assist line AL and the source line SL are capacitively coupled.

The assist circuit 40 drives the assist lines AL0 to ALm. The assist circuit 40 is included in the column control circuit 15 shown in FIG. 1. The assist circuit 40 is controlled by a control signal from a controller 19. The assist circuit 40 is provided with assist drivers 41-0 to 41-m. The assist drivers 41-0 to 41-m are connected respectively to the assist lines AL0 to ALm. The assist driver 41 applies a predetermined voltage to the assist line AL.

The bit lines BL0 to BLm are connected respectively to write drivers 23A-0 to 23A-m. The source lines SL0 to SLm are connected respectively to the write drivers 23A-0 to 23A-m. Configurations of the write drivers 23A and 23B are the same as those in the first embodiment.

[2] Writing Operation

Next, a write operation according to the third embodiment will be described. Hereinafter, "0"-writing (AP to P) in which a magnetization state of an MTJ element 27 is set from an antiparallel state (AP) to a parallel state (P) will be described. Regarding "1"-writing (P to AP) in which the magnetization state of the MTJ element 27 is set from the parallel state (P) to the antiparallel state (AP), a single write pulse is used as in the first embodiment. Hereinafter, examples in the write operation will be described.

[2-1] First Example

FIG. 27 is a timing chart for explaining a write operation according to the first example.

At time t1, a write driver 23B applies a voltage VddW to a source line SL, and a write driver 23A applies a ground voltage Vss to a bit line BL. Consequently, a write current I1 flows through the MTJ element 27.

At time t2, an assist circuit 40 applies a voltage V1 as an assist signal to an assist line AL. At this time, due to capacitance coupling of the assist line AL with the bit line BL and the source line SL, a positive-side (positive polarity) and protrusion-like assist pulse is applied to a write pulse. The "positive-side" means that a current is high with respect to a standard write pulse. A current level of the assist pulse is a current I2. A height of the assist pulse is a current "I2-I1" and has a relationship of I2>I1.

The assist pulse is not limited to a rectangular wave, means a mountain (angle) waveform having an amplitude different from a standard current level, and is also called a spike. The assist pulse includes a waveform in which a slope of a current is different with respect to a standard write pulse. Namely, the assist pulse includes the overall current waveforms having a rising current inclined with respect to a substantially flat current level of the standard write pulse. In other embodiments, the assist pulse has the same meaning.

Thereafter, at time t3, the write pulse and a voltage of the assist line AL is turned off. The timing of turning off the voltage of the assist line AL may be after the timing of turning off the write pulse.

The protrusion-like assist pulse added to the write pulse can give the MTJ element 27 a trigger for escape from a metastable state. Consequently, WER can be reduced.

[2-2] Second Example

FIG. 28 is a timing chart for explaining a write operation according to a second example.

At time t1, a write driver 23B applies a voltage VddW to a source line SL, and a write driver 23A applies a ground voltage Vss to a bit line BL. Consequently, a write current I1 flows through an MTJ element 27. An assist circuit 40 applies a voltage V1 as an assist signal to an assist line AL. The timing of applying a voltage to the assist line AL may be before application of a write pulse.

At time t2, the assist circuit 40 turns off the voltage of the assist line AL, that is, applies the ground voltage Vss to the assist line AL. At this time, due to capacitance coupling of the assist line AL with the bit line BL and the source line SL, a negative-side (negative polarity) and protrusion-like assist pulse is applied to the write pulse. The "negative-side" means that a current is low with respect to a standard write pulse. A current level of the assist pulse is a current I3. A height of the assist pulse is a current "I1-I3" and I1>I3. Thereafter, at time t3, the write pulse and a voltage of the assist line AL is turned off. The assist pulse recessed on the negative side with respect to the standard write pulse is included in the expression "an assist pulse is added to a write pulse".

Also in the second example, the protrusion-like assist pulse added to the write pulse can give the MTJ element 27 a trigger for escape from a metastable state.

[2-3] Third Example

Figure 29:
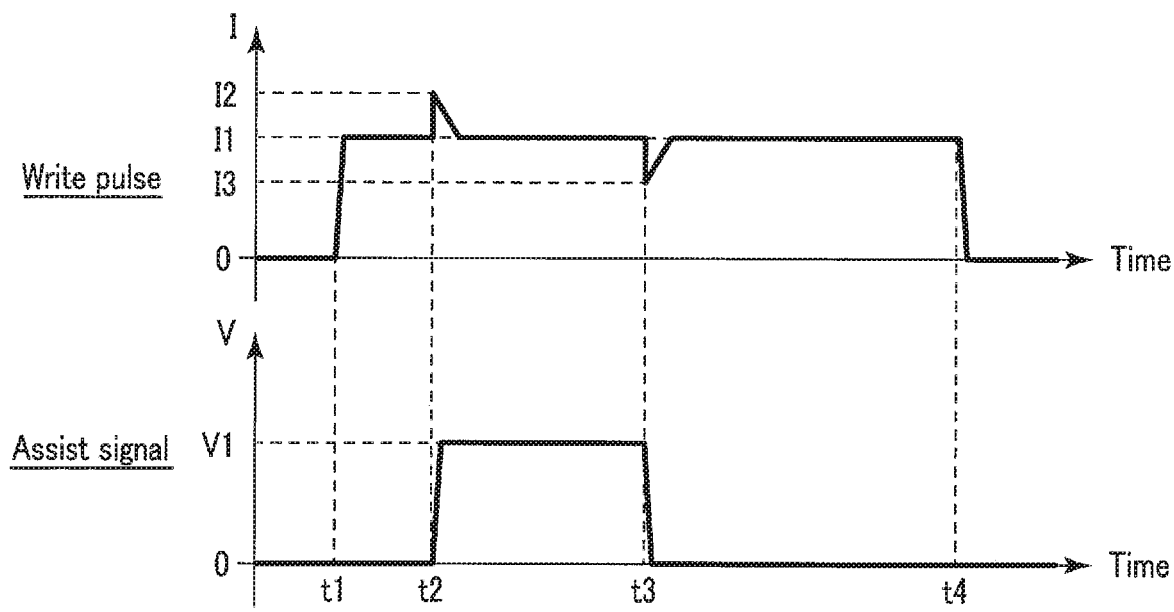
FIG. 29 is a timing chart for explaining a write operation according to a third example.

FIG. 29 is a timing chart for explaining a write operation according to a third example.

At time t1, a write driver 23B applies a voltage VddW to a source line SL, and a write driver 23A applies a ground voltage Vss to a bit line BL. At time t2, an assist circuit 40 applies a voltage V1 as an assist signal to an assist line AL. Consequently, a protrusion-like assist pulse is applied to a write pulse.

At time t3, the assist circuit 40 turns off a voltage of the assist line AL. Consequently, a negative-side and protrusion-like assist pulse is applied to the write pulse. Thereafter, at time t4, the write pulse is turned off.

In the third example, two assist pulses can be applied to the MTJ element 27. In addition, two assist pulses having different polarities can be applied to the MTJ element 27.

[2-4] Fourth Example

Figure 30:
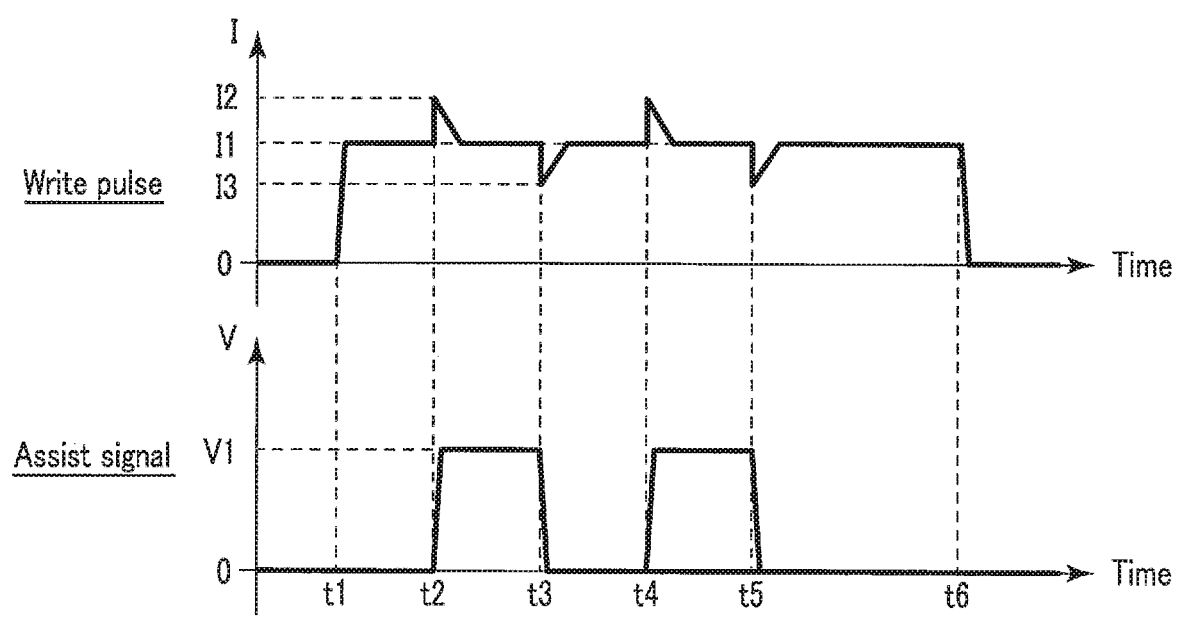
FIG. 30 is a timing chart for explaining a write operation according to a fourth example.

FIG. 30 is a timing chart for explaining a write operation according to a fourth example.

At time t1, a write driver 23B applies a voltage VddW to a source line SL, and a write driver 23A applies a ground voltage Vss to a bit line BL. At time t2, an assist circuit 40 applies a voltage V1 as an assist signal to an assist line AL. Consequently, a protrusion-like assist pulse is applied to a write pulse.

At time t3, the assist circuit 40 turns off a voltage of the assist line AL. Consequently, a negative-side and protrusion-like assist pulse is applied to the write pulse. Similarly, the assist circuit 40 applies an assist pulse to the write pulse at times t4 and t5.

In the fourth example, four assist pulses can be applied to the MTJ element 27. The number of the assist pulses can be arbitrarily set.

A plurality of assist pulses having the same polarity may have different amplitudes (current levels). Specifically, the current level may be different between the assist pulse at time t2 and the assist pulse at time t4. In addition, the current level may be different between the assist pulse at time t3 and the assist pulse at time t5.

All or some of intervals of a plurality of assist pulses may be different.

[2-5] Fifth Example

Figure 31:
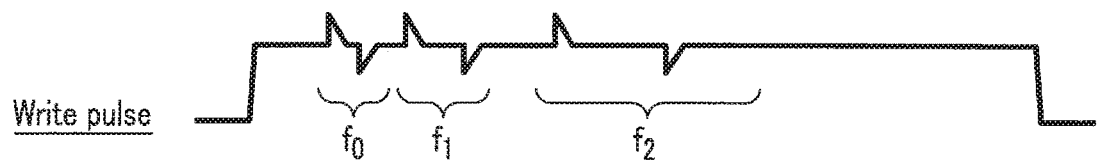
FIG. 31 is a view for explaining a write pulse according to a fifth example.

FIG. 31 is a view for explaining a write pulse according to a fifth example.

A period (frequency) of a set including two assist pulses having different polarities is represented by f. Of periods f (including $f_0$, $f_1$, and $f_2$) of sets, at least two sets are different in period.

As in the fifth example, an interval between the assist pulses can be arbitrarily set. In FIG. 31, although three sets of the assist pulses (six assist pulses) are shown, the number of the assist pulses can be arbitrarily set.

[3] Effects of Third Embodiment

As described above in detail, according to the third embodiment, the effects being the same as those of the first embodiment can be obtained.

In addition, a write current having a desired pulse pattern can be generated without changing the configuration of the write driver 23.

Fourth Embodiment

In a fourth embodiment, an assist pulse is generated by a method different from that of the third embodiment.

[1] Configuration of Write Driver 23

Figure 32:
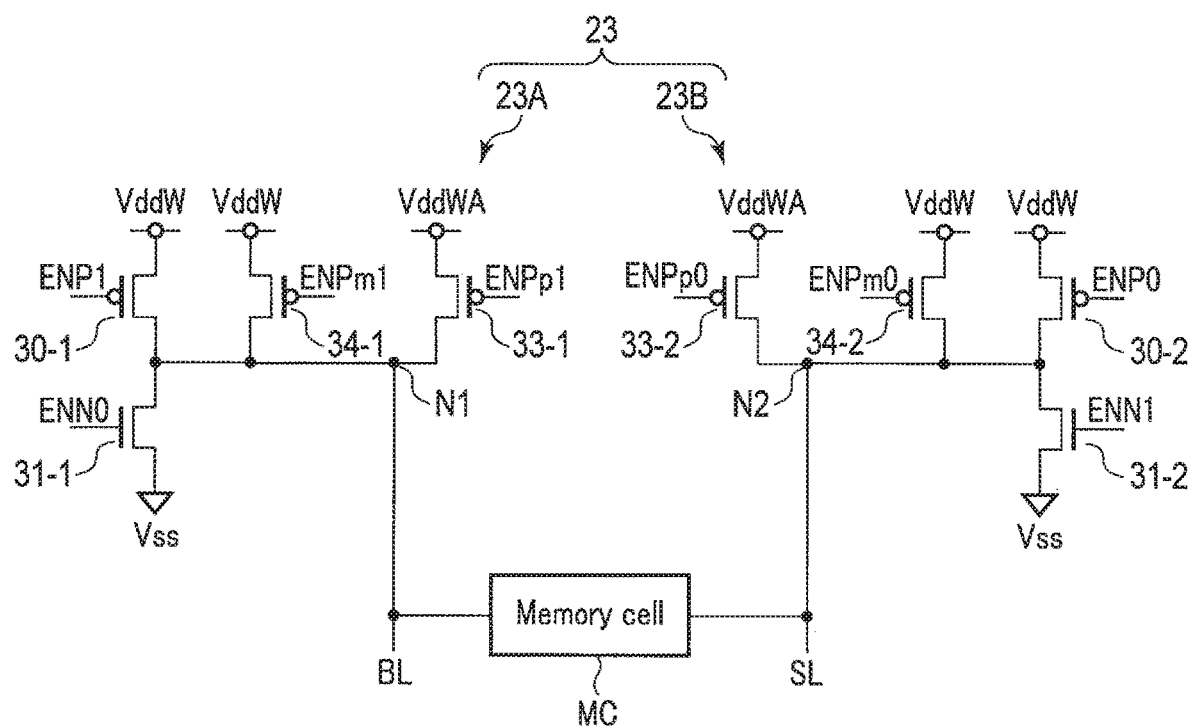
FIG. 32 is a circuit diagram of a write driver according to a fourth embodiment.

FIG. 32 is a circuit diagram of a write driver 23 according to the fourth embodiment. Illustration of a transistor for precharge is omitted. Hereinafter, only portions different from the write driver 23 (23A, 23B) shown in FIG. 21 will be described.

A signal ENPp1 from a controller 19 is input to a gate of a transistor 33-1 included in the write driver 23A. The transistor 33-1 is used for adding a positive-side (positive polarity) assist pulse to the write pulse. The transistor 33-1 applies a power supply voltage VddWA to a bit line BL when the signal ENPp1 is asserted as a low level.

The write driver 23A is further provided with a P-channel MOS transistor 34-1. A source of the transistor 34-1 is connected to a power supply terminal VddW, its drain is connected to a node N1, and its gate receives a signal ENPm1 input from the controller 19. The transistor 34-1 is used for adding a negative-side (negative polarity) assist pulse to the write pulse. The transistor 34-1 applies the power supply voltage VddW to the bit line BL when the signal ENPm1 is low level, and the transistor 34-1 stops application of voltage to the bit line BL when the signal ENPm1 is high level.

A signal ENPp0 from the controller 19 is input to a gate of a transistor 33-2 included in the write driver 23B. The transistor 33-2 is used for adding a positive polarity assist pulse to the write pulse. The transistor 33-2 applies the power supply voltage VddWA to a source line SL when the signal ENPp0 is asserted as a low level.

The write driver 23B is further provided with a P-channel MOS transistor 34-2. A source of the transistor 34-2 is connected to a power supply terminal VddW, its drain is connected to a node N2, and its gate receives a signal ENPm0 input from the controller 19. The transistor 34-2 is used for adding a negative polarity assist pulse to the write pulse. The transistor 34-2 applies the power supply voltage VddW to the source line SL when the signal ENPm0 is low level, and the transistor 34-2 stops application of voltage to the source line SL when the signal ENPm0 is high level.

[2] Writing Operation

Next, a write operation ("0"-writing) according to the fourth embodiment will be described. Hereinafter, examples in the writing operation will be described.

[2-1] First Example

Figure 33:
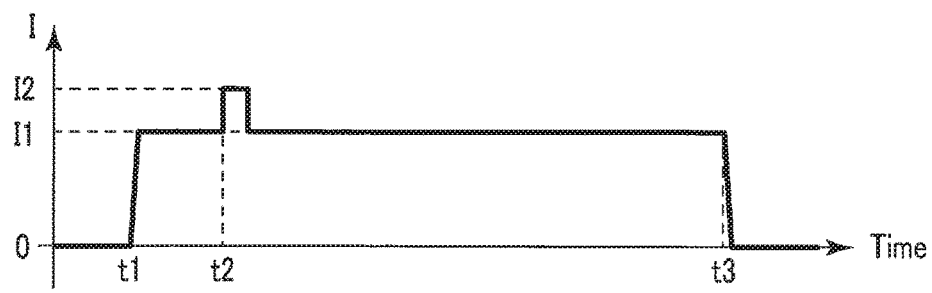
FIG. 33 is a view for explaining a write pulse according to a first example.

FIG. 33 is a view for explaining a write pulse (a write current) according to a first example.

At time t1, a write driver 23B applies a voltage VddW to a source line SL, and a write driver 23A applies a ground voltage Vss to a bit line BL. Specifically, in the write driver 23B, a transistor 30-2 is turned on, and transistors 31-2, 33-2, and 34-2 are turned off.

At time t2, the write driver 23B applies an assist pulse to the write pulse. Specifically, in the write driver 23B, the transistor 33-2 is turned on only during a time corresponding to a width of the assist pulse. Consequently, a voltage VddWA is applied to the source line SL. A height of the assist pulse is a current "I2-I1" and has a relationship of I2>I1. The height of the assist pulse is determined according to a difference between the voltage VddW and the voltage VddWA. Thereafter, at time t3, the write pulse is turned off.

The protrusion-like assist pulse added to the write pulse can give an MTJ element 27 a trigger for escape from a metastable state. Consequently, WER can be reduced.

[2-2] Second Example

Figure 34:
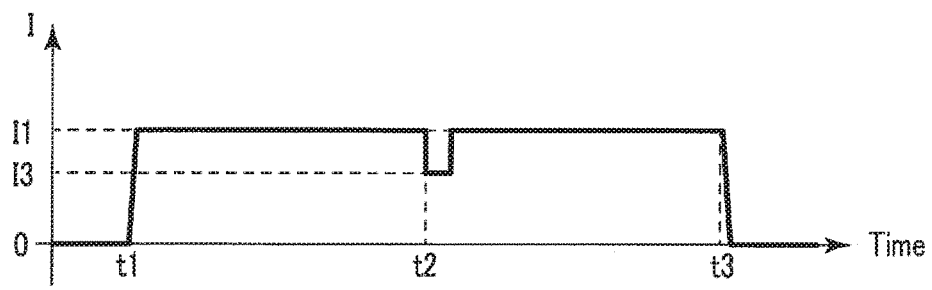
FIG. 34 is a view for explaining a write pulse according to a second example.

FIG. 34 is a view for explaining a write pulse according to a second example.

At time t1, a write driver 23B applies a voltage VddW to a source line SL, and a write driver 23A applies a ground voltage Vss to a bit line BL. Specifically, in the write driver 23B, transistors 30-2 and 34-2 are turned on, and transistors 31-2 and 33-2 are turned off.

At time t2, the write driver 23B applies a negative-side assist pulse to the write pulse. A height of the assist pulse is a current "I1-I3" and has a relationship of I1>I3. Specifically, in the write driver 23B, the transistor 34-2 is turned off. Consequently, since application of the voltage VddW from the transistor 34-2 is stopped, a current amount supplied to the source line SL is reduced, so that a voltage of the source line SL is temporarily lowered. After the voltage of the source line SL is temporarily lowered, a current level of the source line SL is returned to a current I1 by a voltage applied from the transistor 30-2 to the source line SL.

Thereafter, at time t3, the write pulse is turned off. Also in the second example, a protrusion-like assist pulse added to the write pulse can give an MTJ element 27 a trigger for escape from a metastable state.

[2-3] Third Example

Figure 35:
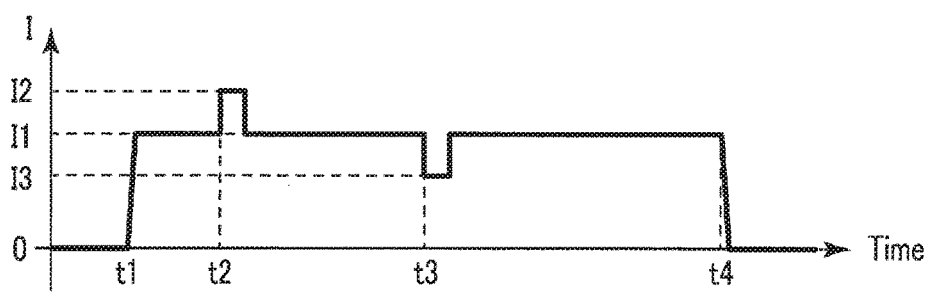
FIG. 35 is a view for explaining a write pulse according to a third example.

FIG. 35 is a view for explaining a write pulse according to a third example.

At time t1, a write driver 23B applies a voltage VddW to a source line SL, and a write driver 23A applies a ground voltage Vss to a bit line BL. At time t2, the write driver 23B applies a positive-side assist pulse to the write pulse. At time t3, the write driver 23B applies a negative-side assist pulse to the write pulse. Thereafter, at time t4, the write pulse is turned off.

In the third example, two assist pulses can be applied to an MTJ element 27. In addition, two assist pulses having different polarities can be applied to the MTJ element 27.

[2-4] Fourth Example

Figure 36:
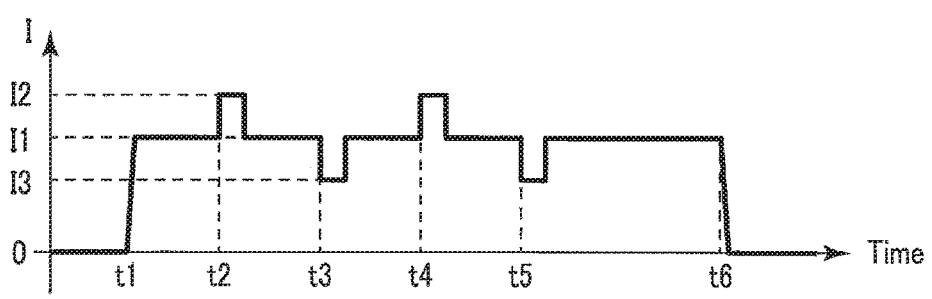
FIG. 36 is a view for explaining a write pulse according to a fourth example.

FIG. 36 is a view for explaining a write pulse according to a fourth example.

At time t1, a write driver 23B applies a voltage VddW to a source line SL, and a write driver 23A applies a ground voltage Vss to a bit line BL. At respective times t2 and t3, the write driver 23B applies a positive-side assist pulse and a negative-side assist pulse to the write pulse. Similarly, at respective times t4 and t5, the write driver 23B applies the positive-side assist pulse and the negative-side assist pulse to the write pulse.

In the fourth example, four assist pulses can be applied to an MTJ element 27. The number of the assist pulses can be arbitrarily set. In addition, an interval of the assist pulse can be arbitrarily set.

[2-5] Fifth Example

Figure 37:
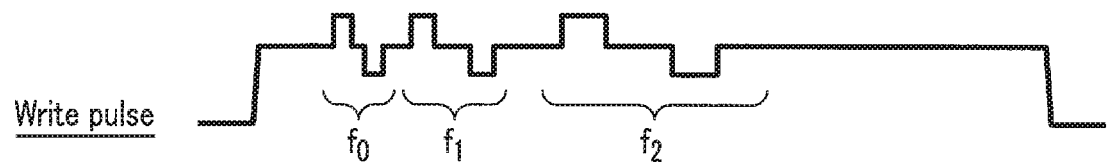
FIG. 37 is a view for explaining a write pulse according to a fifth example.

FIG. 37 is a view for explaining a write pulse according to a fifth example.

A period (frequency) of a set including two assist pulses having different polarities is represented by f. Of periods f (including $f_0$, $f_1$, and $f_2$) of sets, at least two sets are different in period. Two sets being different in period may be different in only a width of an assist pulse, only an interval between assist pulses, or both of them.

[3] Effects of Fourth Embodiment

As described above in detail, according to the fourth embodiment, the effects being the same as those of the first embodiment can be obtained.

In addition, in the fourth embodiment, as compared with the third embodiment, a write current having a desired pulse pattern can be generated without an assist line AL and an assist circuit 40.

Fifth Embodiment

In the fifth embodiment, a voltage applied to a bit line BL or a source line SL during a write operation is a waveform.

[1] Configuration of Voltage Generator 20

Figure 38:
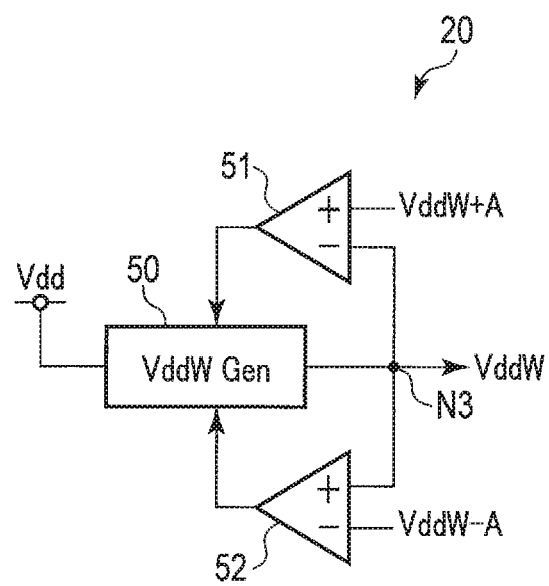
FIG. 38 is a block diagram of a voltage generator according to a fifth embodiment.

FIG. 38 is a block diagram of a voltage generator 20 according to the fifth embodiment. FIG. 38 shows an extracted circuit for generating a voltage VddW to be supplied to a write driver 23.

The voltage generator 20 is provided with a voltage generator (VddW Gen) 50 for the voltage VddW and comparators 51 and 52.

A negative-side input terminal of the comparator 51 is connected to a node N3, and a voltage "VddW+A" is applied to a positive-side input terminal of the comparator 51. The voltage "VddW+A" is slightly higher (higher by a predetermined voltage "A") than the target voltage VddW. The comparator 51 compares voltages of two input terminals and outputs a comparison result.

A voltage "VddW−A" is supplied to a negative-side input terminal of the comparator 52, and a positive-side input terminal of the comparator 52 is connected to a node N3. The voltage "VddW−A" is slightly lower (lower by the predetermined voltage "A") than the target voltage VddW. The comparator 52 compares voltages of two input terminals and outputs a comparison result.

The voltage generator 50 uses outputs of the comparators 51 and 52 and performs control such that an output voltage periodically changes within a range of "±A".

The voltage generator 50 includes a so-called regulator circuit. The voltage generator 50 generates the voltage VddW from its power supply voltage Vdd. In such case, the voltage generator 50 receives outputs of the comparators 51 and 52 and generates the voltage VddW according to the comparison results of the comparators 51 and 52. Here, the power supply voltage Vdd and the voltage VddW have a relationship of "Vdd>VddW(Vdd>VddW+A)". The voltage generator 50 may include a so-called booster circuit (charge pump circuit). In such case, the voltage generator 50 boosts the power supply voltage Vdd and generates the voltage VddW. Similar to the case where the voltage generator 50 includes the regulator circuit, the voltage generator 50 receives outputs of the comparators 51 and 52 and generates the voltage VddW according to the comparison results of the comparators 51 and 52. An output of the voltage generator 50 is connected to the node N3. Namely, the voltage VddW is output from the node N3.

The power supply voltage Vdd supplied to the voltage generator 50 is one example, and the voltage generator 50 may be operated using a voltage other than the power supply voltage Vdd, or a desired voltage may be generated using a plurality of voltages.

The write driver 23 receiving the voltage VddW has the same configuration as that in FIG. 5.

[2] Writing Operation

Next, a write operation ("0"-writing) according to the fifth embodiment will be described. Hereinafter, examples in the writing operation will be described.

[2-1] First Example

Figure 39:
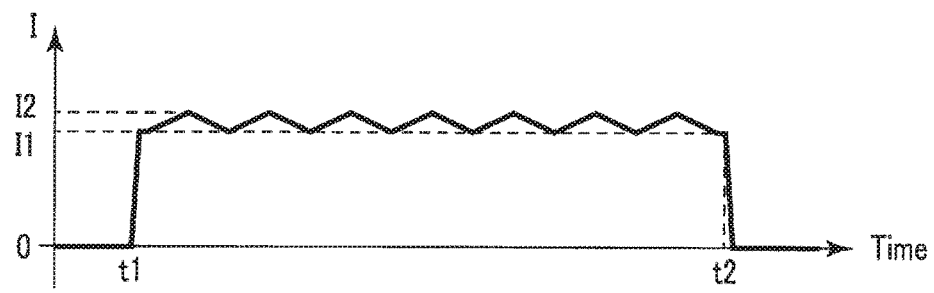
FIG. 39 is a view for explaining a write pulse according to a first example.

FIG. 39 is a view for explaining a write pulse (a write current) according to a first example.

In the first example, a voltage generator 50 is controlled by a comparator 51. When a voltage of a node N3 is lowered to a target voltage VddW, the voltage generator 50 performs boosting operation. When the voltage of the node N3 reaches a voltage "VddW+A", the voltage generator 50 stops the boosting operation. The voltage generator 50 repeats the above operation.

At time t1, a write driver 23B applies a voltage to a source line SL with the use of the voltage VddW from the voltage generator 50. A write driver 23A applies a ground voltage Vss to a bit line BL. According to this constitution, a write pulse having a waveform periodically varying between a current I1 and a current I2 can be generated. The current I1 is set based on the target voltage VddW, and the current I2 is set based on the voltage "VddW+A". Thereafter, at time t2, the write pulse is turned off.

In FIG. 39, a mountain corresponds to an assist pulse. The write pulse having a waveform in which a current varies can give an MTJ element 27 a trigger for escape from a metastable state. Consequently, WER can be reduced.

[2-2] Second Example

Figure 40:
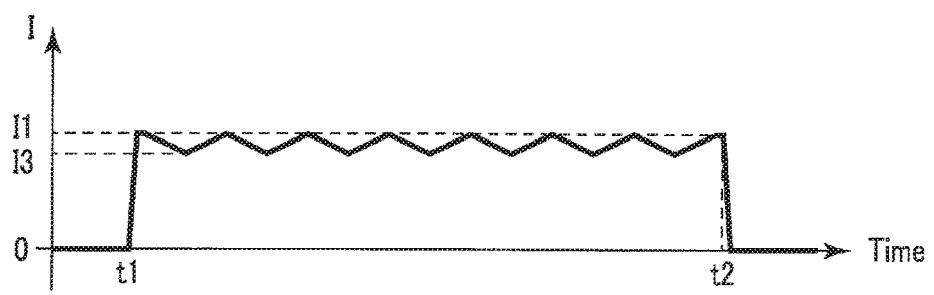
FIG. 40 is a view for explaining a write pulse according to a second example.

FIG. 40 is a view for explaining a write pulse according to a second example.

In the second example, a voltage generator 50 is controlled by a comparator 52. When a voltage of a node N3 is lowered to a voltage "VddW−A", the voltage generator 50 performs boosting operation. When the voltage of the node N3 reaches a target voltage VddW, the voltage generator 50 stops the boosting operation. The voltage generator 50 repeats the above operation.

Write drivers 23A and 23B generate write pulses with the use of the voltage VddW from the voltage generator 50. According to this constitution, a write pulse having a waveform periodically varying between a current I1 and a current I3 can be generated. The current I1 is set based on the target voltage VddW, and the current I3 is set based on the voltage "VddW−A".

[2-3] Third Example

Figure 41:
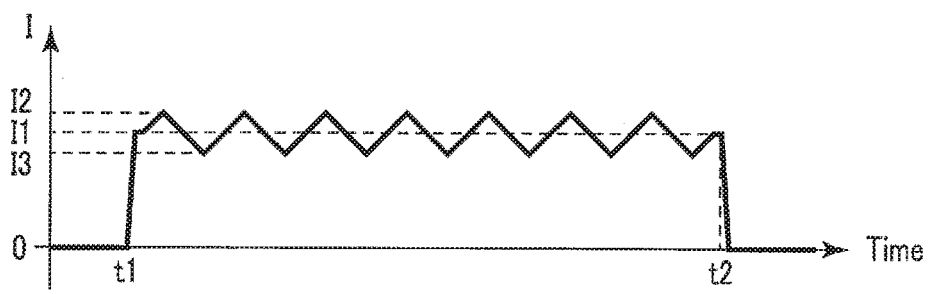
FIG. 41 is a view for explaining a write pulse according to a third example.

FIG. 41 is a view for explaining a write pulse according to a third example.

In the third example, a voltage generator 50 is controlled by comparators 51 and 52. When a voltage of a node N3 reaches a voltage "VddW+A", the voltage generator 50 stops boosting operation. When the voltage of the node N3 is lowered to a voltage "VddW−A", the voltage generator 50 performs the boosting operation. The voltage generator 50 repeats the above operation.

Write drivers 23A and 23B generate write pulses with the use of a voltage VddW from the voltage generator 50. According to this constitution, a write pulse having a waveform periodically varying between a current I3 and a current I2 can be generated.

[2-4] Fourth Example

Figure 42:
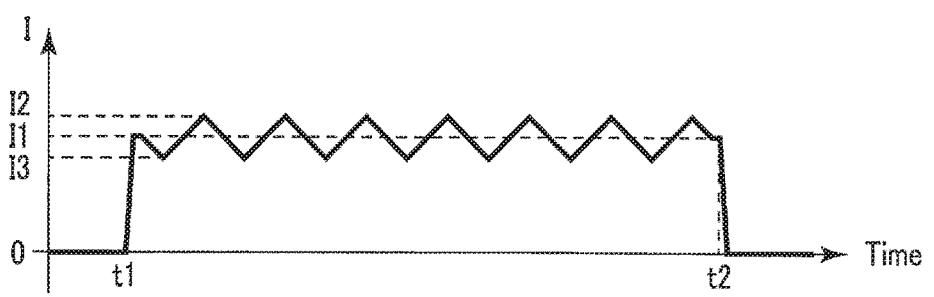
FIG. 42 is a view for explaining a write pulse according to a fourth example.

FIG. 42 is a view for explaining a write pulse according to a fourth example.

A write pulse of the fourth example has a polarity opposite to that of the third example. A write pulse in FIG. 42 can be obtained by controlling boosting operation, stop of boosting, and an order.

[3] Effects of Fifth Embodiment

As described above in detail, according to the fifth embodiment, the effects being the same as those of the first embodiment can be obtained.

In addition, in the fifth embodiment, a write current having a desired pulse pattern can be generated without changing the configuration of a write driver 23.

The MRAM shown in each of the above embodiments may be STT-MRAM (spin-transfer torque magnetoresistive random access memory) using a spin-transfer torque phenomenon in magnetization reversal of a magnetic layer.

Further, in each of the above embodiments, although MRAM using a magnetoresistive effect element is described as an example of a semiconductor memory device, the present invention is not limited thereto. In particular, the present invention is applicable to various types of semiconductor memory devices which can perform the write operation with the use of the write current having the pulse pattern described in each of the above embodiments.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a magnetoresistive element including first and second magnetic layers and a non-magnetic layer provided between the first and second magnetic layers; and
a write circuit which controls a first writing which sets magnetization of the first and second magnetic layers to a parallel state and a second writing which sets the magnetization of the first and second magnetic layers to an antiparallel state, wherein the write circuit applies a first write current to the magnetoresistive element in the first writing and a second write current different from the first write current to the magnetoresistive element in the second writing,
wherein:
the first write current comprises a first pulse and a second pulse added to the first pulse,
a width of the second pulse is smaller than a width of the first pulse,
a current level of the second pulse is different from a current level of the first pulse, and
the second write current is a single pulse.

2. The device of claim 1, wherein the current level of the second pulse is higher than the current level of the first pulse.

3. The device of claim 1, wherein the current level of the second pulse is lower than the current level of the first pulse.

4. The device of claim 1, wherein:
the first write current further comprises a third pulse added to the first pulse,
a width of the third pulse is smaller than the width of the first pulse, and
a current level of the third pulse is different from the current level of the first pulse.

5. The device of claim 4, wherein:
the current level of the second pulse is higher than the current level of the first pulse, and
the current level of the third pulse is lower than the current level of the first pulse.

6. The device of claim 4, wherein:
the first write current further comprises fourth and fifth pulses added to the first pulse,
each width of the fourth and fifth pulses is smaller than the width of the first pulse,
a current level of the fifth pulse is different from a current level of the fourth pulse, and
an interval between the fourth pulse and the fifth pulse is different from an interval between the second pulse and the third pulse.

7. The device of claim 6, wherein an interval between the third pulse and the fourth pulse is different from the interval between the second pulse and the third pulse.

8. The device of claim 1, further comprising:
a first line electrically connected to a first terminal of the magnetoresistive element;
a second line electrically connected to a second terminal of the magnetoresistive element;
a third line provided between the first and second lines and electrically disconnected from the first line, the second line, and the magnetoresistive element; and
a driver which is connected to the third line and applies a voltage to the third line.

9. The device of claim 1, further comprising:
a first line electrically connected to a first terminal of the magnetoresistive element; and
a second line electrically connected to a second terminal of the magnetoresistive element,
wherein the write circuit comprises a first driver which generates the first pulse by using a first power supply voltage, and a second driver which generates the second pulse by using a second power supply voltage.

10. The device of claim 1, further comprising:
a first line electrically connected to a first terminal of the magnetoresistive element;
a second line electrically connected to a second terminal of the magnetoresistive element; and
a voltage generator which generates a voltage of a waveform in which a voltage level changes,
wherein the write circuit applies the first write current to the magnetoresistive element by using the voltage generated by the voltage generator.

* * * * *